United States Patent [19]
How et al.

[11] Patent Number: 6,014,038
[45] Date of Patent: Jan. 11, 2000

[54] FUNCTION BLOCK ARCHITECTURE FOR GATE ARRAY

[75] Inventors: Dana How, Palo Alto; Adi Srinivasan, Fremont; Abbas El Gamal, Palo Alto, all of Calif.

[73] Assignee: LightSpeed Semiconductor Corporation, Sunnyvale, Calif.

[21] Appl. No.: 08/821,475

[22] Filed: Mar. 21, 1997

[51] Int. Cl.[7] ............................. G06F 7/38; H03K 19/173
[52] U.S. Cl. ............................... 326/46; 326/40; 326/41; 326/47; 327/407
[58] Field of Search .................... 326/46, 40, 38, 326/39, 41, 44, 105, 106, 37, 49, 50; 327/407, 408

[56] References Cited

U.S. PATENT DOCUMENTS

| | | | |
|---|---|---|---|
| 4,706,216 | 11/1987 | Carter | 365/94 |
| 4,786,904 | 11/1988 | Graham, III et al. | 340/825.83 |
| 4,975,601 | 12/1990 | Steele | 326/38 |
| 5,128,559 | 7/1992 | Steele | 326/38 |
| 5,206,184 | 4/1993 | Allen et al. | 437/51 |
| 5,341,041 | 8/1994 | El Gamal . | |
| 5,365,125 | 11/1994 | Goetting et al. | 326/39 |
| 5,386,154 | 1/1995 | Goetting et al. | 326/44 |
| 5,416,784 | 5/1995 | Johnson | 371/22.5 |
| 5,451,887 | 9/1995 | El-Avat et al. | 326/39 |
| 5,477,165 | 12/1995 | ElAyat et al. | 326/38 |
| 5,488,316 | 1/1996 | Freeman et al. | 326/41 |
| 5,488,318 | 1/1996 | Vajapey et al. | 326/48 |
| 5,500,608 | 3/1996 | Goetting et al. | 326/39 |
| 5,513,190 | 4/1996 | Johnson et al. | 371/22.5 |
| 5,533,032 | 7/1996 | Johnson | 371/22.5 |
| 5,570,041 | 10/1996 | El-Avat et al. | 326/41 |
| 5,592,105 | 1/1997 | Cheung et al. | 328/38 |

OTHER PUBLICATIONS

Chip Express® Powerpoint Presentation, as downloaded from www.chipexpress.com on Sep. 10, 1996, pp. 1–18.
Zilinx® The Programmable Logic Data Book, Sep. 1996, pp. 13–14, 4–294–4–295, 4–11–4–17.
Brown, et al. "FPGA and CPLD Architectures: A Tutorial", IEEE Design & Test of Computers, vol. 13, No. 2, Jun. 1, 1996, pp. 42–57.
Bursky, "Efficient RAM–Based FPGAs Ease System Design", Electronic Design, Jan. 22, 1996, No. 2., pp. 53,54,58,60,62.
Brown, et al.; "FPGA and CPLD Architectures: A Tutorial" IEEE Design & Test of Computers, vol. 13, No. 2, Jun. 1, 1996.
Bursky; "Efficient RAM–Based FPGAs Ease System Design" vol. 44, No. 2, Jan. 22, 1996.

*Primary Examiner*—Michael Tokar
*Assistant Examiner*—Daniel D. Chang
*Attorney, Agent, or Firm*—Fliesler, Dubb, Meyer & Lovejoy LLP

[57] ABSTRACT

A gate array in accordance with the invention includes a matrix of function blocks capable of being configured to implement combinational, sequential, and memory modes of operation, as well as providing tri-state drivers and buffers in useful numbers. The function block includes a logic circuit with a first bit storage unit, which is selectively configurable to behave as combinational logic or to store a first bit, and a second bit storage unit, which is also selectively configurable to behave as combinational logic or to store a second bit. The matrix of function blocks in accordance with the invention is also useful to properly distribute clocks throughout the gate array.

42 Claims, 18 Drawing Sheets

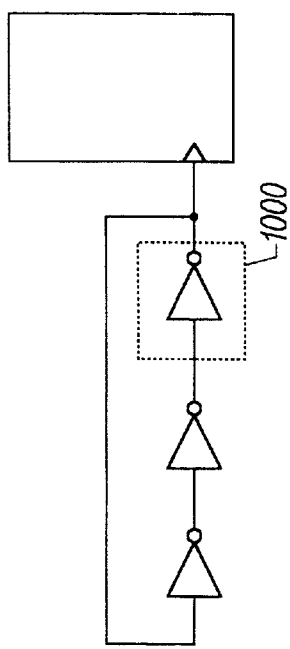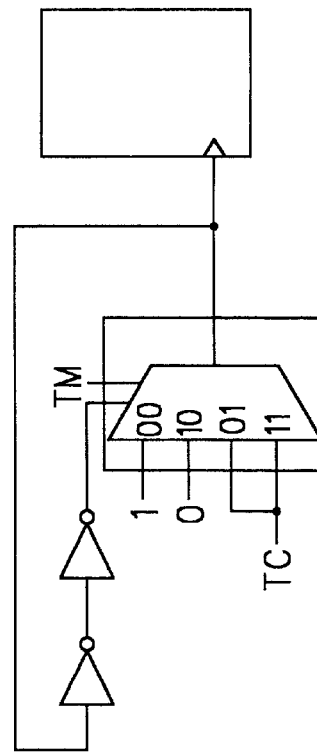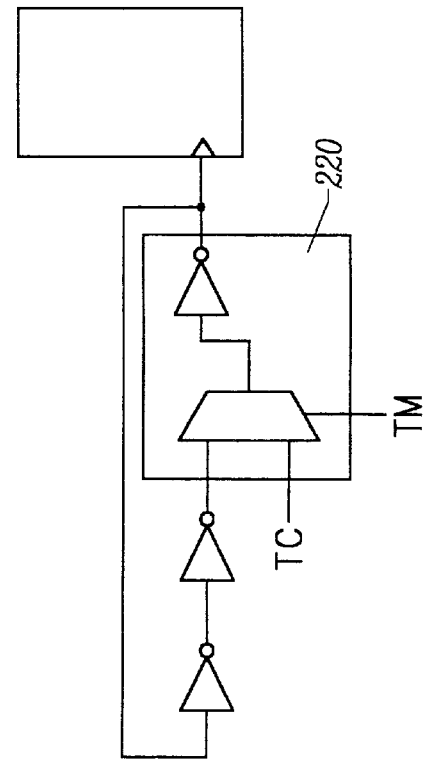

FUNCTION BLOCK ARCHITECTURE FOR GATE ARRAY

BACKGROUND OF THE INVENTION

1. Field of the Invention

The invention relates generally to integrated circuits, and in particular to function blocks for use in integrated circuits such as gate arrays.

2. Related Art

Gate arrays are popular among integrated circuit (IC) designers as a generally economical way of customizing ICs to obtain application specific integrated circuits. Gate arrays are generally composed of a predefined matrix (or array) of configurable transistor blocks or, in general, function blocks, which can be formed into a specified circuit by interconnecting them.

Of great importance to an IC designer in implementing circuit designs with a gate array is the functionality available from the gate array. That is, the IC designer may have circuit designs which include a large number of different combinational functions (e.g., Boolean logic), sequential functions (e.g., flip-flops, latches), and/or memory functions (e.g., SRAM), and the designer would prefer a gate array which efficiently implements a significant majority of his or her design so that the overall design is implemented in the smallest space possible. Since gate arrays are formed of a matrix of function blocks, the functionality available in each gate array will be primarily determined by the function block architecture.

Also important to an IC designer is customization time. Particularly during the design stages, the IC designer wants to obtain a model, or prototype, of his or her designs quickly so that the designs can be tested and used with other circuitry.

One approach to gate arrays is to create a function block with primarily freestanding transistors, that is, transistors that have few, if any, internal connections to one another within the function block. The transistors within such a function block often vary in size and drive capability with respect to one another to aid in achieving various functions. In order to customize a function block with freestanding transistors, routing of connections between the transistors within the function block must be undertaken as specified by an IC designer. There are generally three to five layers of connecting wires formed over the transistor layer, and each layer requires at least two masking steps to form (one step to form vias to the layer below and one step to form connecting wires). Thus, six to ten masking steps must be undertaken to fully customize a gate array of this type. So although this approach allows for circuit flexibility by allowing for implementation of combinational and sequential functions, as well as memory functions, such an approach will bear additional costs due to multiple masking and routing steps. In addition, because of the multiple masking steps required, production time for customizing the gate array can be considerable.

A second approach to gate arrays, and one having a more rapid customization time, is field programmable gate arrays (FPGAs). The function block configuration in an FPGA is often composed of a fixed circuit of multiplexers and other logic gates and is usually arranged such that varying the input signals to the function block will form various useful functions. Thus, to customize a gate array, an IC designer can specify signals to be coupled to the inputs and outputs for each function block.

FPGA customization time tends to be more rapid than other types of gate arrays because the transistor layer and all connection layers (all vias and wires) are fixed. Also fixed and in between the function blocks in the matrix is an interconnect structure formed of a plurality of intersecting wires. At each intersection is either a fuse or a programmable RAM bit. Thus, to program function block functionality (i.e., to control input signals to each function block), either a fuse is stressed to melt and form a connection at the intersection, or a RAM bit is programmed to form this connection. Since the entire FPGA structure is fixed by the manufacturer, no additional mask steps are required and FPGA programming can actually be done by the IC designer with equipment and software at his or her own place of business. Commonly, an IC designer will specify a function (often from a library) which the designer wishes the function block to perform and the signals to be coupled to function block inputs and outputs are then determined and programmed by software.

Despite rapid and easy customization, FPGAs currently available have drawbacks. First, FPGAs are often used in intermediate design steps for test purposes, but cannot often be used in a final product: because of the nature of the FPGA interconnect structure, an FPGA often will not meet the performance expectations of the final product (e.g., timing) and thus has only limited use in test situations.

Second, few, if any, FPGA manufacturers have developed a function block architecture which can fully support the functionality (e.g., combinational, sequential, and memory functions) required by an IC designer. Almost all FPGA producers produce function blocks capable of implementing a variety of combinational circuits (e.g., Boolean function). A few FPGA suppliers in addition to providing circuits capable of combinational logic, will also provide distinct function blocks for sequential logic (e.g., flip-flops, latches) spaced periodically throughout the FPGA array. While providing the designer with periodic function blocks for sequential function support is helpful, these sequential function blocks may not be in an ideal location with respect to other function blocks (e.g., those supporting combinational functions), may not occur often enough to adequately support IC designs, and particularly may be less than ideal with respect to routing, timing, and other placement issues.

Other FPGA providers provide function blocks which can support both combinational and sequential functions. However, these function blocks are usually designed so that the circuitry supporting each of these function types is separate and distinct within the function block. While providing more options to the designer, this approach will significantly limit gate arrays in size since each function block takes up considerably more space in accommodating distinct circuitry to support each function type. Nonetheless, most FPGA providers using this approach still tend to only place function blocks containing both combinational and sequential logic at periodic intervals throughout the array.

As IC designers create more and more complex IC designs, they are demanding more functional capabilities from gate arrays while further demanding that customization time remain low, that gate array die size remain small, and that device reliability remain high. So, although available gate arrays allow some flexibility to the IC designer, improved architectures for gate arrays are always desirable. Particularly desirable is any architectural design that allows increased flexibility and functionality while reducing customization time.

SUMMARY OF THE INVENTION

In order to overcome the problems discussed above, an improved gate array function block architecture is disclosed.

The disclosed function block architecture is a fixed, compact circuit, which allows the function block to be configured by input signals to perform combinational, sequential, or memory functions. Moreover, the function block is designed to support tri-state driver, buffering, clock distribution, and other functions necessary for circuit designs implemented with a gate array. Further, gate array customization requires only minimal masking steps to form connections between the function blocks.

The function block architecture in accordance with the invention is divided into three modules: two computational modules and a communication module. Each computational module includes a plurality of inputs and a logic circuit configurable to operate in one of multiple modes of operation; and an output. The multiple modes of operation include a combinational mode of operation and a sequential mode of operation. Some embodiments of the invention further include a memory mode of operation, as well as mixed modes of operation. The logic circuit is configured to operate in one of the multiple modes of operation by applying a set of input signals to the plurality of inputs.

The logic circuit includes a first bit storage unit, which is selectively configurable to store a first bit, and a second bit storage unit, which is selectively configurable to store a second bit. When the logic circuit is in a combinational mode of operation, the first bit storage unit and the second bit storage unit are configured to operate as combinational logic, which, in one embodiment, may be a buffering function. When the logic circuit is in a sequential mode of operation at least one of the first bit storage unit and second bit storage unit are configured to store a bit. In addition, in certain embodiments of the invention, the bit storage units can be configured to be accessed either serially, in one mode of operation, or directly, in a second mode of operation.

Each communication module includes a second plurality of inputs; a second logic circuit configurable to operate in one of second multiple modes of operation; and an output. The multiple modes of operation for the communication module include a tri-state driver mode of operation, a buffer mode of operation, and a clock distribution mode of operation. One of the second plurality of inputs is for receiving an input signal in each of the tri-state driver, buffer, and clock distribution modes of operation. The output from the communication module is for carrying an output signal from each of the tri-state driver, buffer, and clock distribution modes of operation. The second logic circuit is configured to operate in one of the second multiple modes of operation by applying a second set of input signals to the second plurality of inputs.

In one embodiment of the invention, the second logic circuit includes a multiplexer and a tri-state inverter. In a second embodiment, the second logic circuit includes a tri-state buffer.

A function block in accordance with the invention is advantageous in that it is a highly flexible circuit which is relatively small in size, thereby allowing more complicated and larger circuit designs to be implemented on a gate array.

A function block in accordance with the invention is further advantageous in that the function block internal connections are fixed, allowing faster customization time and fewer production errors.

A function block in accordance with the invention is further advantageous in that it utilizes one circuit, including the same output lines and input lines, for all modes of operation, allowing a smaller function block size.

A block in accordance with the invention is further advantageous in that it provides drivers and buffers at regular and useful intervals.

A gate array in accordance with the invention is further advantageous in that clock skew due to clock distribution and clock gating can be minimized.

A gate array in accordance with the invention is also advantageous in that it allows testing of hard to test circuitry, including internally generated clocks.

Other advantages of a gate array in accordance with the invention will be clear to those of skill in the art upon review of the following detailed description.

BRIEF DESCRIPTION OF THE DRAWINGS

The present invention is described with respect to particular exemplary embodiments thereof and reference is accordingly made to the drawings (which are not necessarily drawn to scale) in which like reference numbers denote like parts, in which.

Figure 21:
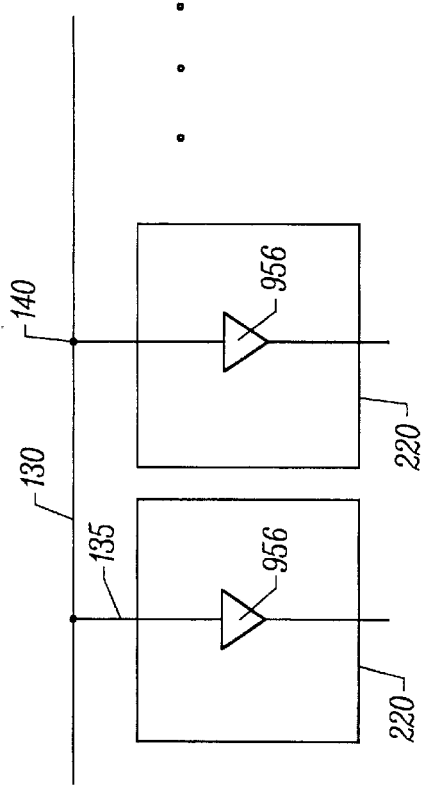
Figure 20:
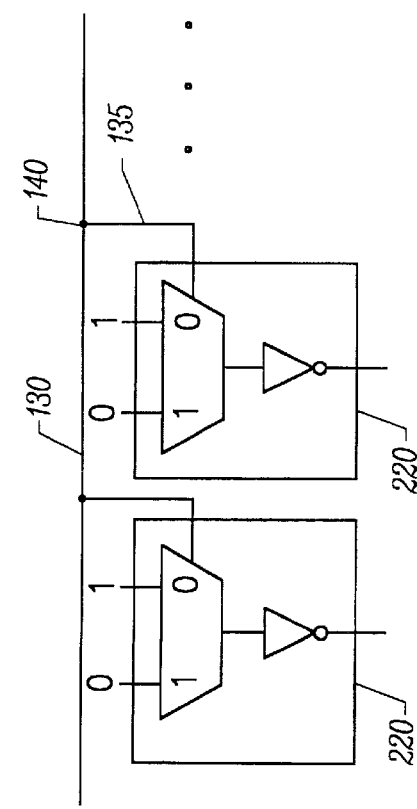
Figure 22:
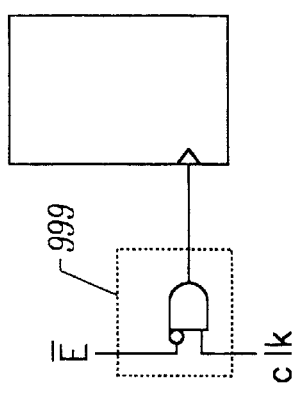
Figure 23:
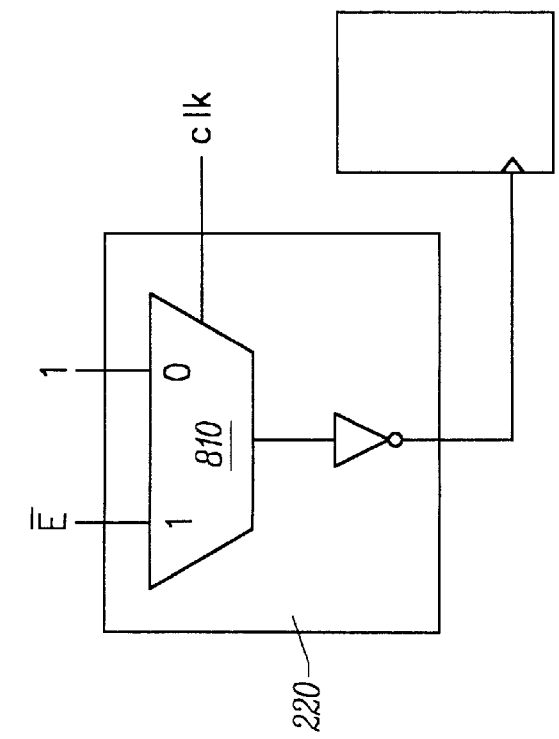
Figure 24:
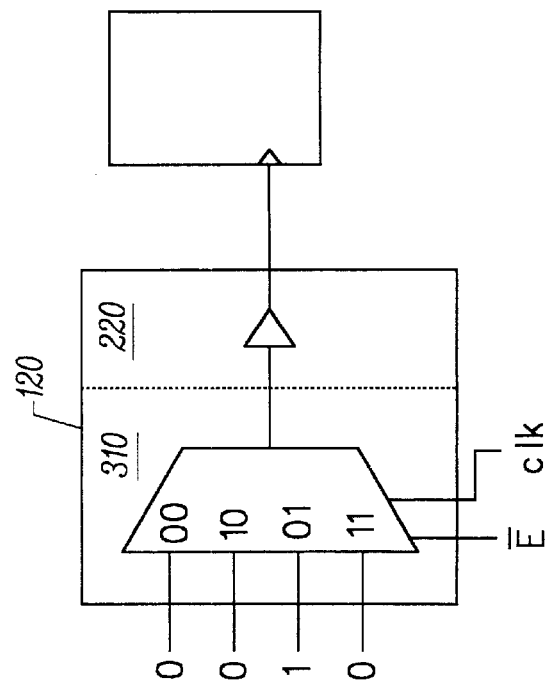
Figure 9:
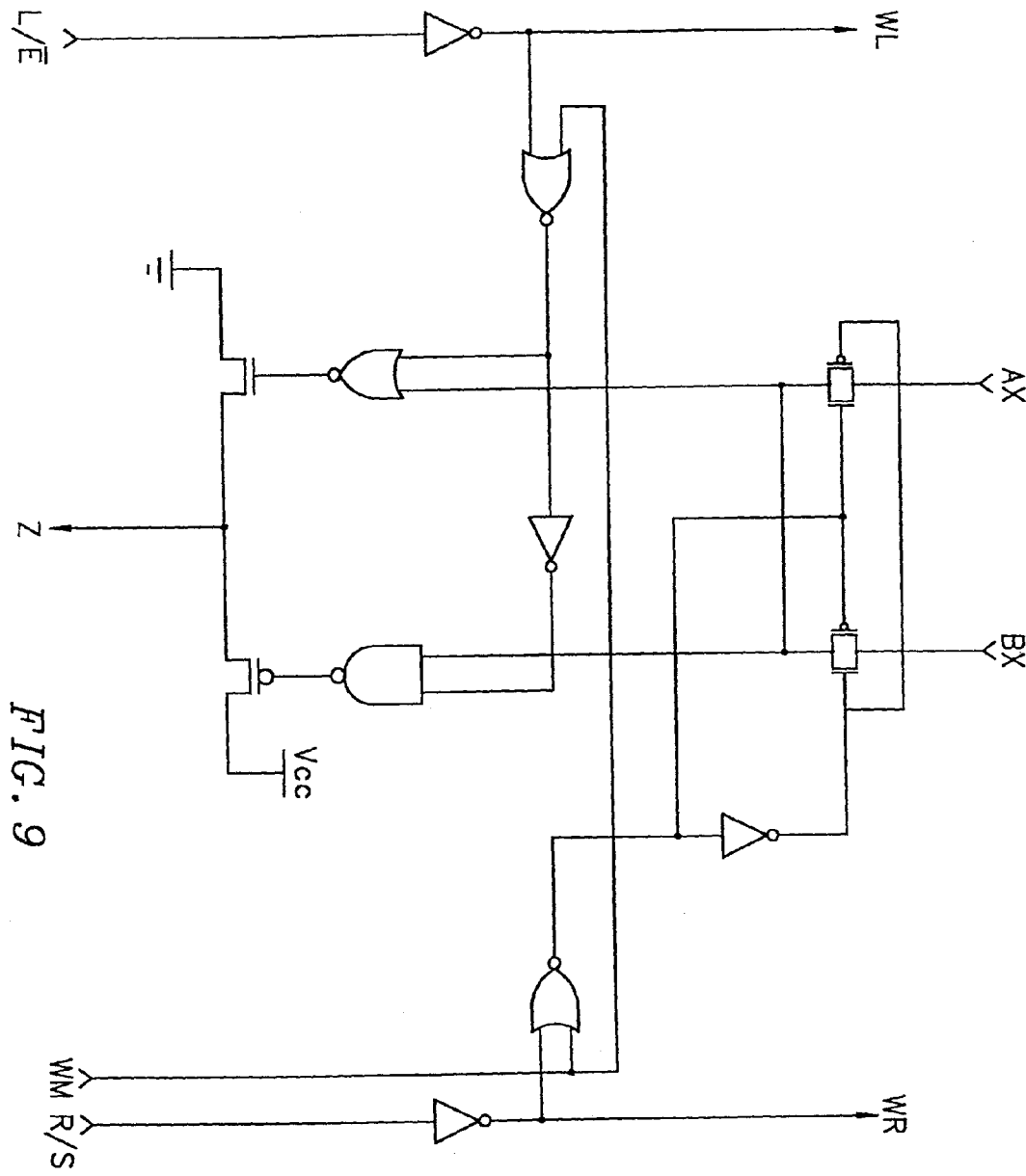
Figure 11:
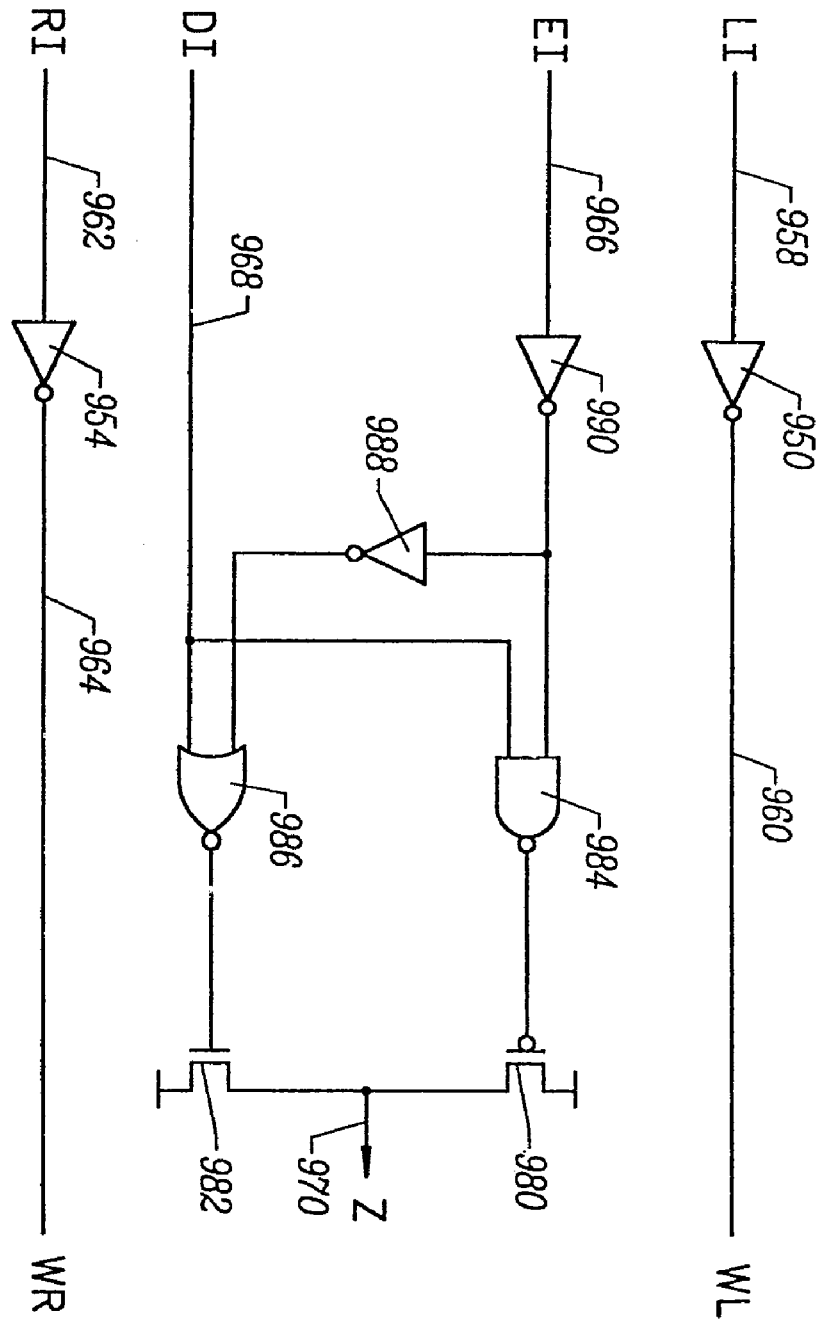

7) in accordance with the invention when configured in a buffer mode of operation;

FIG. 20 is a functional, simplified block diagram of an embodiment of a communication module (shown in FIG. 7) in accordance with the invention when configured for clock distribution;

FIG. 21 is a functional, simplified block diagram of an embodiment of a communication module (shown in FIG. 10) in accordance with the invention when configured for clock distribution;

FIG. 22 is a functional block diagram of a gated clock coupled to a flip-flop;

FIG. 23 is a functional, simplified block diagram of an embodiment of a communication module (shown in FIG. 7) in accordance with the invention when configured for clock gating;

FIG. 24 is a functional, simplified block diagram of an embodiment of a computation module and a communication module (shown in FIG. 10) in accordance with the invention when configured for clock gating;

FIG. 25 is a functional block diagram of a flip-flop coupled to a ring oscillator;

FIG. 26 is a functional, simplified block diagram of an embodiment of a communication module (shown in FIG. 7) in accordance with the invention when configured for testing an internally generated clock; and FIG. 27 is a functional, simplified block diagram of a computation module in accordance with the invention when configured for testing an internally generated clock.

DETAILED DESCRIPTION

Figure 1:
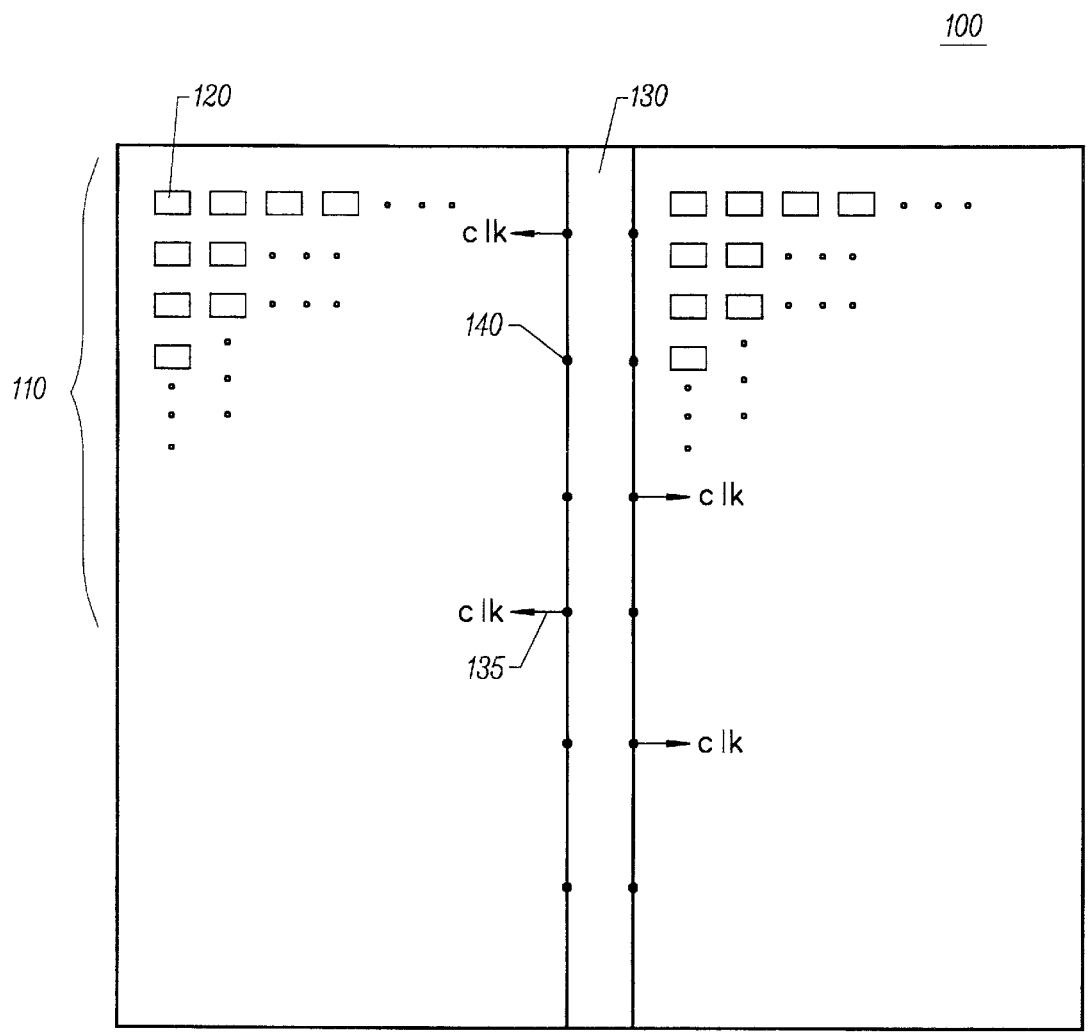
FIG. 1 is a block diagram of a gate array in accordance with the invention.

A functional block diagram of gate array 100 in accordance with the invention is shown in FIG. 1. Gate array 100 includes a matrix (or array) 110 of function blocks 120. In the preferred embodiment, each function block is identical to the other blocks in matrix 110, although other embodiments of the invention allow for variance among function blocks. In one embodiment of the invention, matrix 110 regularity is broken by clock trunk 130, which extends across the gate array 100 and is used for clock distribution throughout the gate array. As shown, clock signals 135 leave clock trunk 130 from ports 140, which are regularly distributed along the edge of clock trunk 130.

Figure 2:
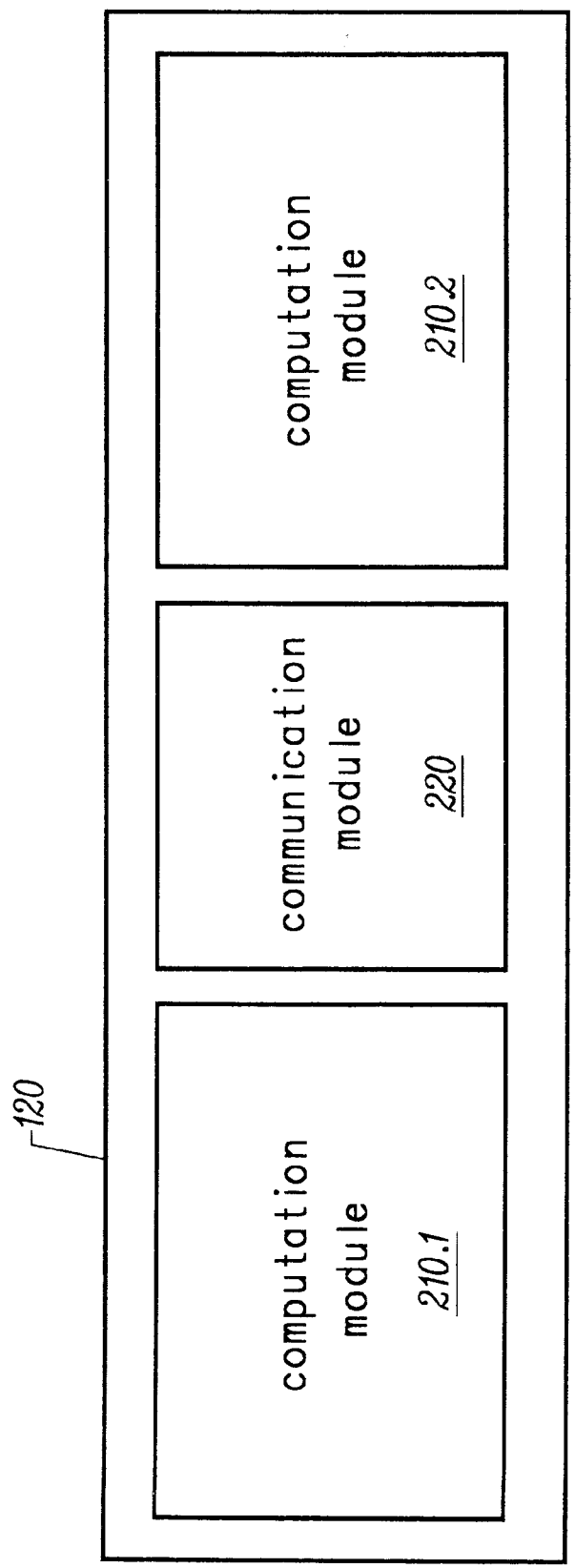
FIG. 2 is a block diagram of a function block in accordance with the invention.

Each function block 120 can be configured to perform combinational functions, sequential functions, and/or memory (e.g., SRAM) functions. As shown in FIG. 2, function block 120 is generally composed of three modules: two computation modules 210.1 and 210.2 and a communication module 220, each having a fixed internal architecture but whose functions can be varied by varying input signals to each module. For instance, an input may be varied by tying it to a logical high signal, a logical low signal, the output of the same or a different module, or a signal from off-chip. Computation modules 210.1 and 210.2 are identical mirror images of each other in one embodiment of the invention and are thus generally referred to with reference number 210.

Figure 3:
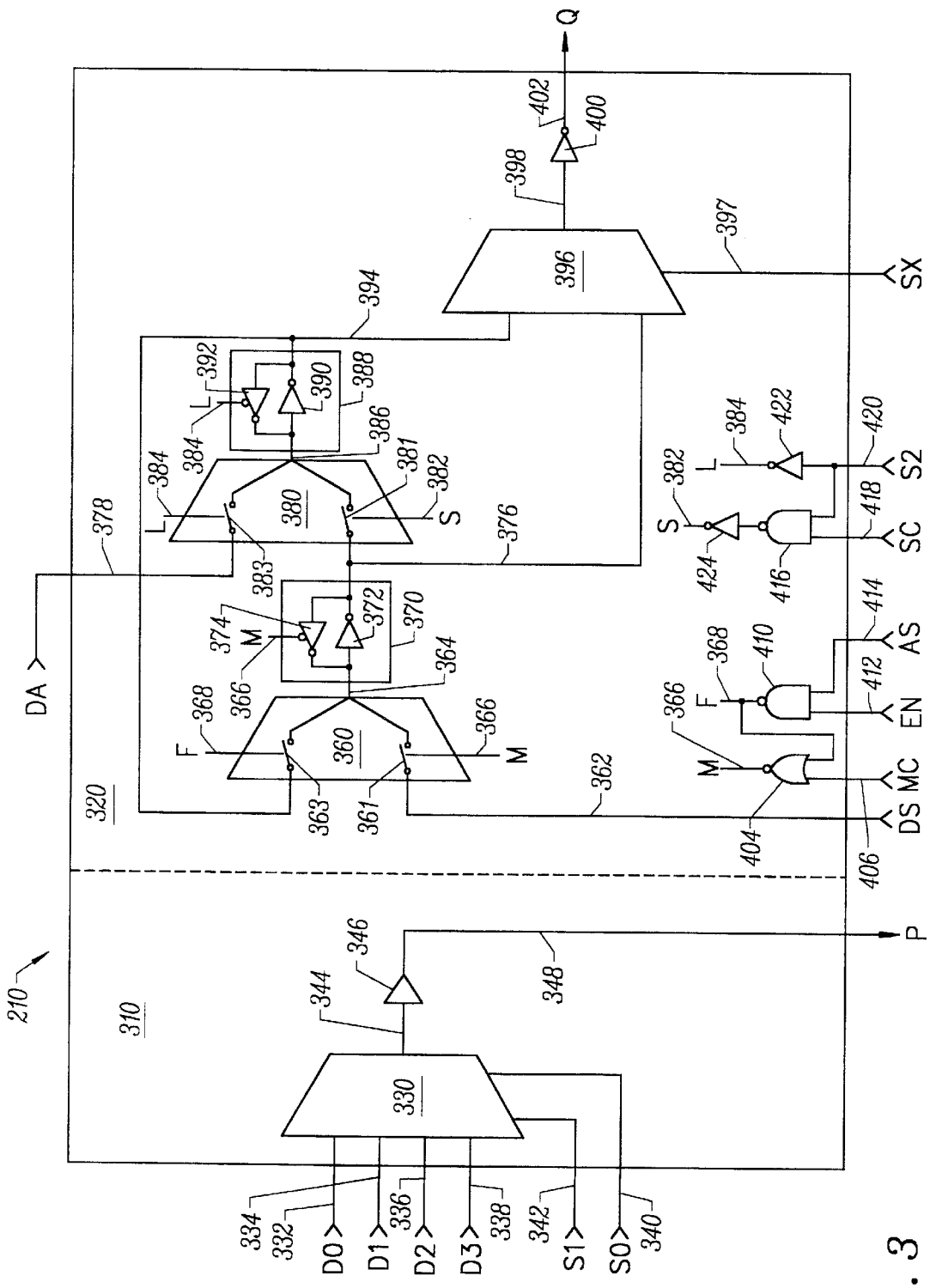
FIG. 3 is a functional block diagram of an embodiment of a computation module in accordance with the invention.

An embodiment of a computation module 210 is functionally shown in FIG. 3 and can be subdivided into two stages, stage one 310 and stage two 320. Stage one includes multiplexer 330 having four inputs D0–D3 332–338 and two select inputs S0 and S1, 340 and 342, respectively. Select lines S0 340 and S1 342 select a data input D0–D3 332–338 to be output from multiplexer 330 onto output line 344. Output 344 is coupled to buffer 346, which outputs a signal P on line 348 from computation module 210.

Stage two 320 generally includes three multiplexers 360, 380, and 396 and two bit storage units 370 and 388. First multiplexer 360 has a first input for receiving a signal DS on line 362 and a second input which is coupled to the output of bit storage unit 388 via line 394. DS serves as a signal input into computation module 210. Multiplexer 360 has two internal paths to its output on line 364. The first, or upper, path couples the input on line 394 to multiplexer output on line 364 when switch 363 is closed. Switch 363 is controlled by signal F on line 368. The second, or lower, path couples the DS signal on line 362 to the output on line 364 when switch 361 is closed. Switch 361 is controlled by signal M on line 366.

Bit storage unit 370 receives as an input the output from multiplexer 360 on line 364. In one embodiment of the invention, bit storage unit 370 is a pair of cross-coupled inverters 372 and 374 as shown in FIG. 3. Inverter 374 is generally designed to be weaker than inverter 372 in order to allow any changing bit outputs from multiplexer 360 to be placed in bit storage unit 370 by overdriving inverter 374. In addition, inverter 374 is enabled and disabled by signal M 366. Thus, bit storage unit 370 can be configured to appear as a simple inverter in certain configurations of computation module 210.

Multiplexer 380 receives as a first input the output of bit storage unit 370 on line 376. The other input to multiplexer 380 is coupled to signal DA on line 378, an input into module 210. Similarly to multiplexer 360, multiplexer 380 has two signal paths, each controlled by a respective switch 381 or 383. Signal S on line 382 controls switch 381 while signal L on line 384 controls switch 383.

Bit storage unit 388 receives as an input the output of multiplexer 380 on line 386. Like bit storage unit 370, bit storage unit 388 is, in one embodiment, composed of a pair of cross-coupled inverters 390 and 392, where inverter 392 is weaker than inverter 390, and where inverter 392 is selectively enabled by signal L on line 384.

Multiplexer 396 receives as a first input the output of bit storage unit 388 on line 394. The second input to multiplexer 396 is received from the output 376 of bit storage unit 370. Multiplexer 396 further has a select input SX, which multiplexer 396 receives on line 397 and which selects one of the multiplexer's inputs to be output onto line 398.

Line 398 is coupled to inverter 400, which serves as a buffering mechanism and which outputs signal Q on line 402, a second output from computation module 210.

In addition, stage two 320 of computation module 210 also includes select and enable logic, which selects the various switches in multiplexers 360 and 380 as well as enables inverters 374 and 392 in bit storage units 370 and 388, respectively. The select and enable logic in one embodiment includes NOR gate 404, NAND gate 410, NAND gate 416, and inverters 422 and 424.

NOR gate 404 has a first input MC on line 406, an input into computation module 210, and a second input received from the output of NAND gate 410 via line 368. NOR gate 404 outputs signal M on line 366, which controls switch 361 and enables inverter 374.

Inputs to NAND gate 410 are EN on line 412 and AS on line 414, both inputs to computation module 210. The output 368 from NAND gate 410 is the signal F which controls switch 363 in multiplexer 360.

NAND gate 416 receives as inputs signal SC on line 418 and signal S2 on line 420, both inputs to computation module 210. The output of NAND gate 416 is coupled to inverter 424, which outputs signal S on line 382 to control switch 381 in multiplexer 380.

Inverter 422 also receives signal S2 on line 420 and outputs signal L on line 384 to control switch 383 of multiplexer 380 as well as inverter 392 in bit storage unit 388.

While select and enable logic for computation module 210 is shown in FIG. 3 as NOR, NAND, and inverting gates, a person of ordinary skill in the art will recognize that a number of other gate combinations are possible. Further, select and enable logic is not shown fully connected in FIG. 3 to aid in the clarity of the figures. However, the connections should be clear to those of skill in the art by the signal names and line reference numbers provided. Similar techniques are employed for clarity in other figures as well.

Figure 4:
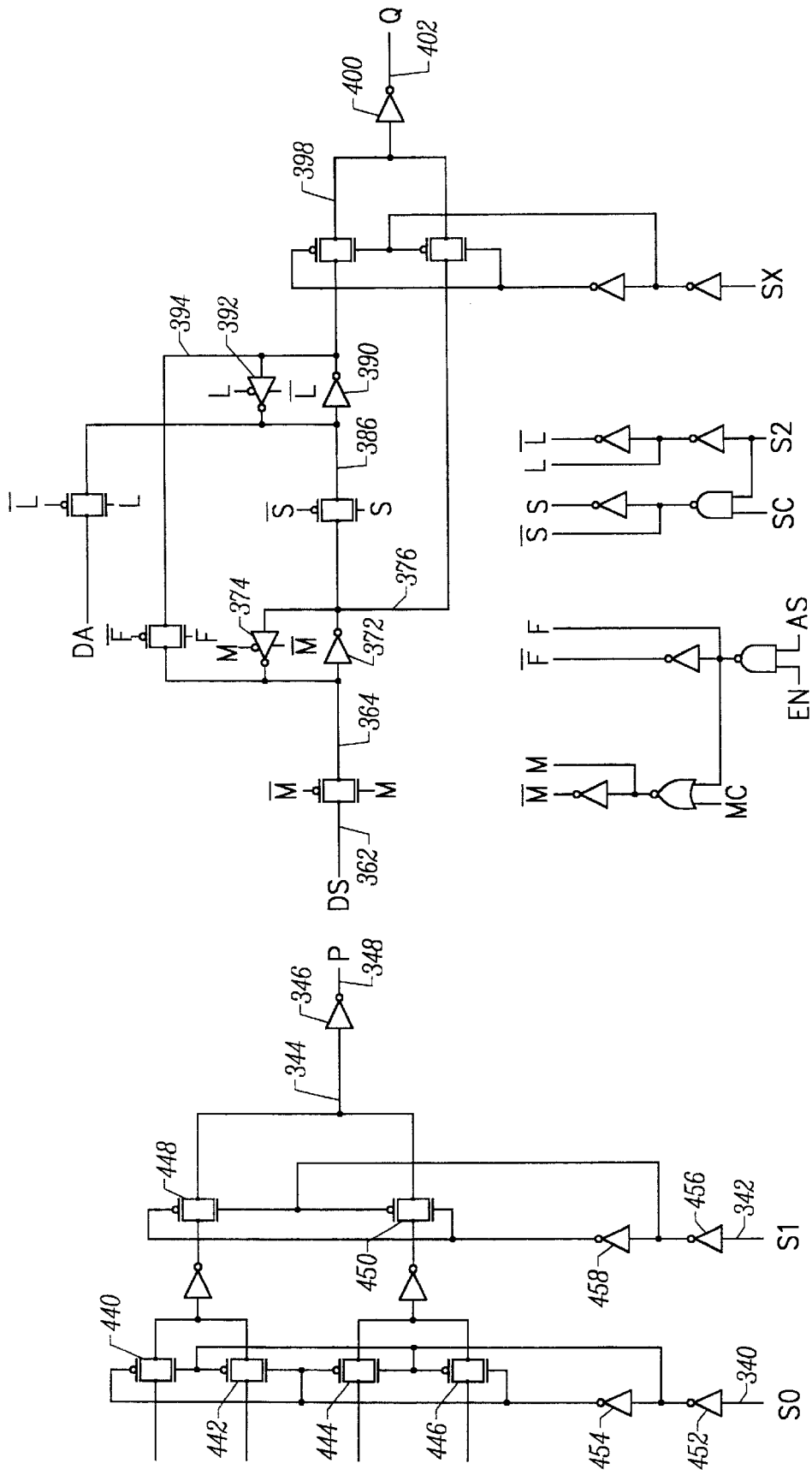
FIG. 4 is a schematic diagram of one embodiment of a computation module in accordance with the invention.

FIG. 4 shows one specific implementation of the computation module shown in FIG. 3. Transmission gates are used to implement the multiplexer/switch functions shown in FIG. 3. Pass gates would also be an acceptable alternative to transmission gates in other embodiments of the invention. Specific details of FIG. 4 will not be further discussed as they will be clear to one of skill in the art upon a comparison of FIG. 4 with FIG. 3. It should further be clear to one of ordinary skill in the art that, although logic gates and inverters are shown, the logic gates in FIG. 4 and other figures are implemented with various transistor configurations. Moreover, one skilled in the art will recognize in FIG. 4 and other figures that various additions, deletions and/or rearrangements of inverters will still result in an equivalent circuit.

Figure 5:
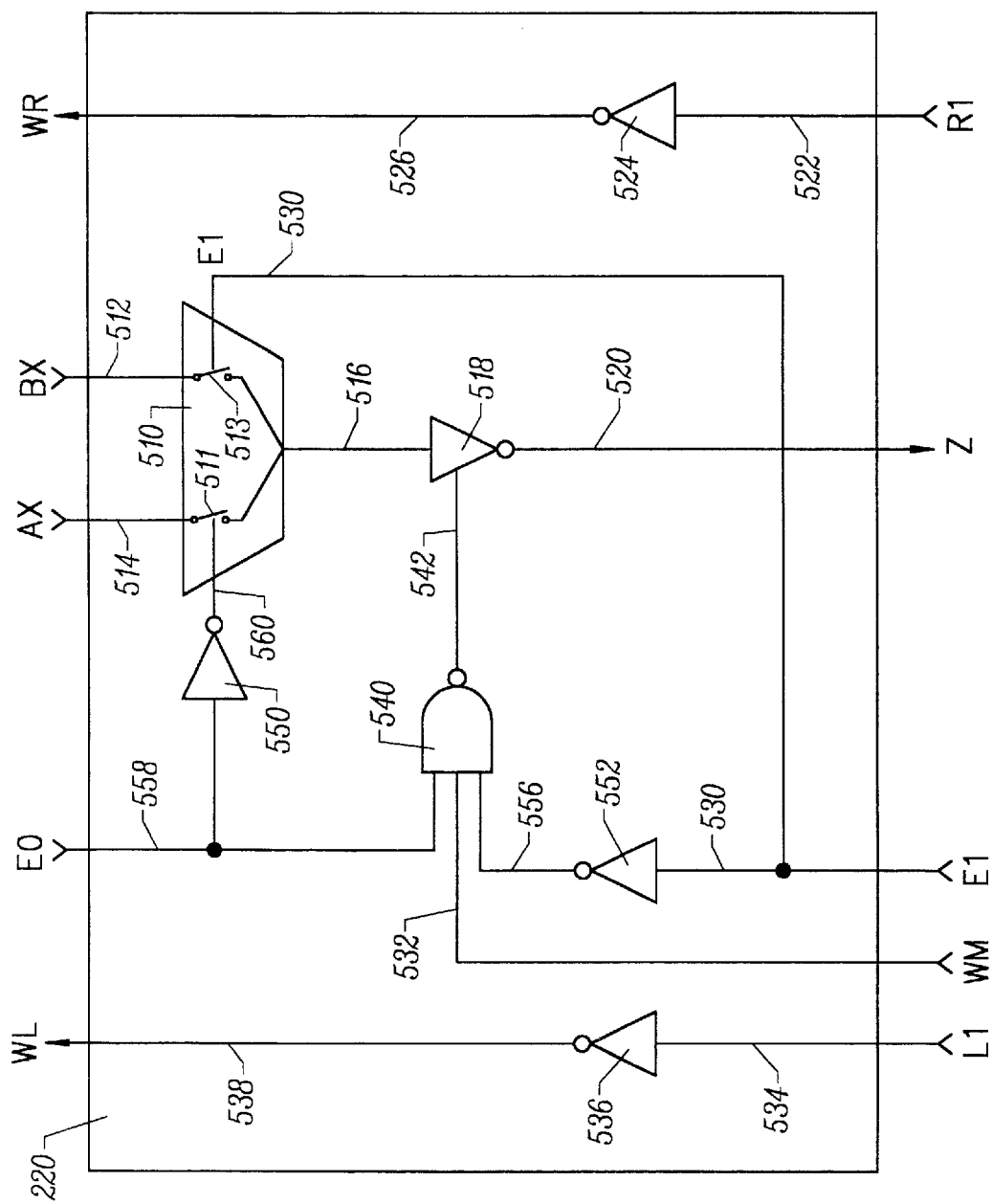
FIG. 5 is a functional block diagram of an embodiment of a communication module in accordance with the invention.

FIG. 5 shows a functional model of communication module 220, and is generally composed of a multiplexer 510, NAND gate 540 and inverters 518, 524, 536, 550, and 552. Multiplexer 510 receives a first input signal AX on line 514 and a second input signal BX on line 512, both inputs into communication module 220. Multiplexer 510 has two signal paths to its output on line 516. The first path couples input signal AX to output 516 with switch 511, which is controlled by a signal on control line 560. The signal on line 560 is received from the output of inverter 550. The input of inverter 550 is signal E0 on line 558, an input into communication module 220. The second path in multiplexer 510 couples input signal BX to output 516 with switch 513, which is controlled by signal E1 on line 530.

Tri-state inverter 518 receives as an input the output from multiplexer 510 on line 516. Inverter 518 outputs signal Z on line 520 from communication module 220. In addition, inverter 518 receives an enable signal on line 542. When the signal on line 542 is deasserted, or low, line 520 is tri-stated.

NAND gate 540 receives three inputs. The first input is a signal on line 556, which is received from the output of inverter 552. The input of inverter 552 is signal E1 on line 530. The second input to NAND gate 540 is a WM signal on line 532, an input to communication module 220. The third input to NAND gate 540 is signal E0 on line 558.

In addition, communication module 220 includes inverters 524 and 536. Inverter 524 receives input signal RI on line 522 and produces output signal WR on line 526. Inverter 536 receives input signal LI on line 534 and produces output signal WL on line 538. In one embodiment of the invention, tri-state driver 518 is designed to be much stronger, and therefore capable of driving more loads, than inverters 524 and 536.

Figure 6:
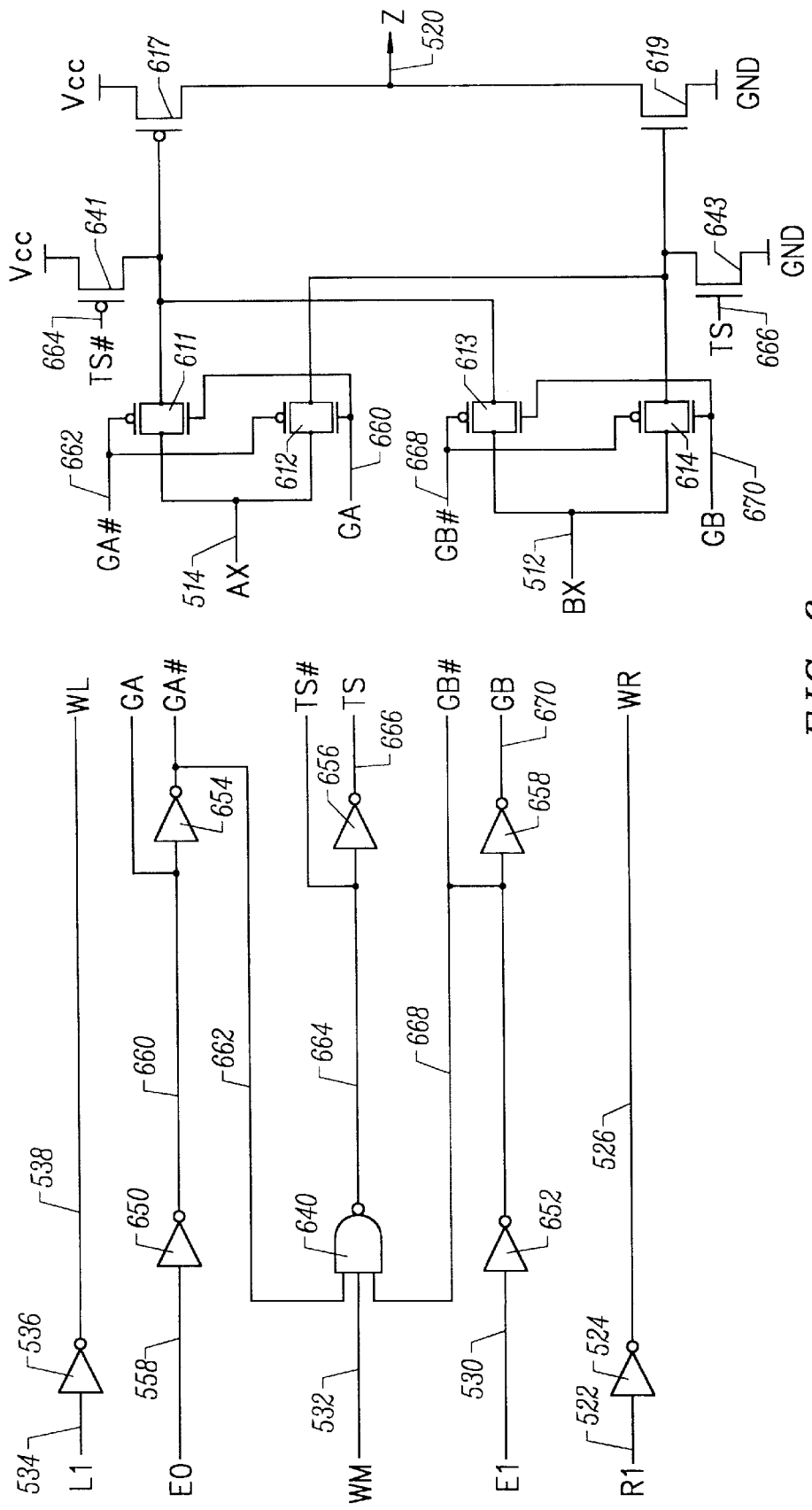
FIG. 6 is a schematic diagram of the embodiment of a communication module shown in FIG. 5.

Shown in FIG. 6 is a specific implementation of the embodiment of communication module 220 shown in FIG. 5. To implement multiplexer 510 and tri-state inverter 518, a number of transmission gates and transistors are utilized in FIG. 6. Pass gates are also acceptable substitutes for transmission gates in alternative embodiments of the invention. In order to implement a tri-state inverter, a p-channel transistor 617 and an n-channel transistor 619 are utilized in a manner similar to a CMOS inverter except the gates of these transistors are not coupled directly together, allowing both transistors to be turned off simultaneously.

To turn both transistors 617 and 619 off simultaneously, pull-up transistor 641 and pull-down transistor 643 are utilized. Transistor 641 is a p-channel transistor whose gate is coupled to the signal TS#. Transistor 643 is an n-channel transistor whose gate is coupled to the signal TS. When TS# is a logical low signal and TS is a logical high signal, both transistors, 641 and 643, are turned on, each respectively causing transistors 617 and 619 to turn off, forcing output Z to tristate. Alternatively, when transistors 641 and 643 are turned off, transistors 617 and 619 implement a CMOS inverter.

Further, in order to allow p-channel transistor 617 and n-channel transistor 619 to be turned off simultaneously for a tri-state output on output Z, multiplexer 510 uses four transmission gates 611, 612, 613 and 614. Transmission gate 611 and transmission gate 612 both receive input signal AX on line 514. The output of transmission gate 611 is coupled to the gate of transistor 617. The output of transmission gate 612 is coupled to the gate of transistor 619. Transmission gates 613 and 614 each receive input BX on line 512. The output of gate 613 is coupled to the gate of transistor 617. The output of transmission gate 614 is coupled to the gate of 619. Both gates 611 and 612 are controlled by the signals GA and GA# (that is, GA is coupled to the n-channel transistor of both transmission gates while GA# is coupled to the p-channel transistor of both transmission gates). Likewise, signals GB and GB# control transmission gates 613 and 614.

To control the multiplexer and tri-state inverter, the implementation of a communication module shown in FIG. 6 uses NAND gate 640 and inverters 650, 652, 654, 656 and 658. Inverter 650 receives input signal E0 on line 558 and produces as an output the signal GA on line 660 and is also coupled to inverter 654. The output of inverter 654 produces the signal GA# on line 662.

Inverter 652 receives input signal E1 on line 530 and produces as an output signal GB# on line 668, which is also coupled to inverter 658. The output of inverter 658 produces GB as an output signal on line 670.

NAND gate 640 has three inputs. The first input is signal GA# on line 662. The second input is signal WM on line 532. The third input is signal GB# on line 668. The output of NAND gate 640 produces signal TS# on line 664 and is also coupled to inverter 656. The output of inverter 656 produces TS as an output signal on line 666.

In addition, inverter 536 receives input signal LI on line 534 and produces signal WL on line 538. Inverter 524 receives signal RI on line 522 and produces signal WR on line 526.

Figure 7:
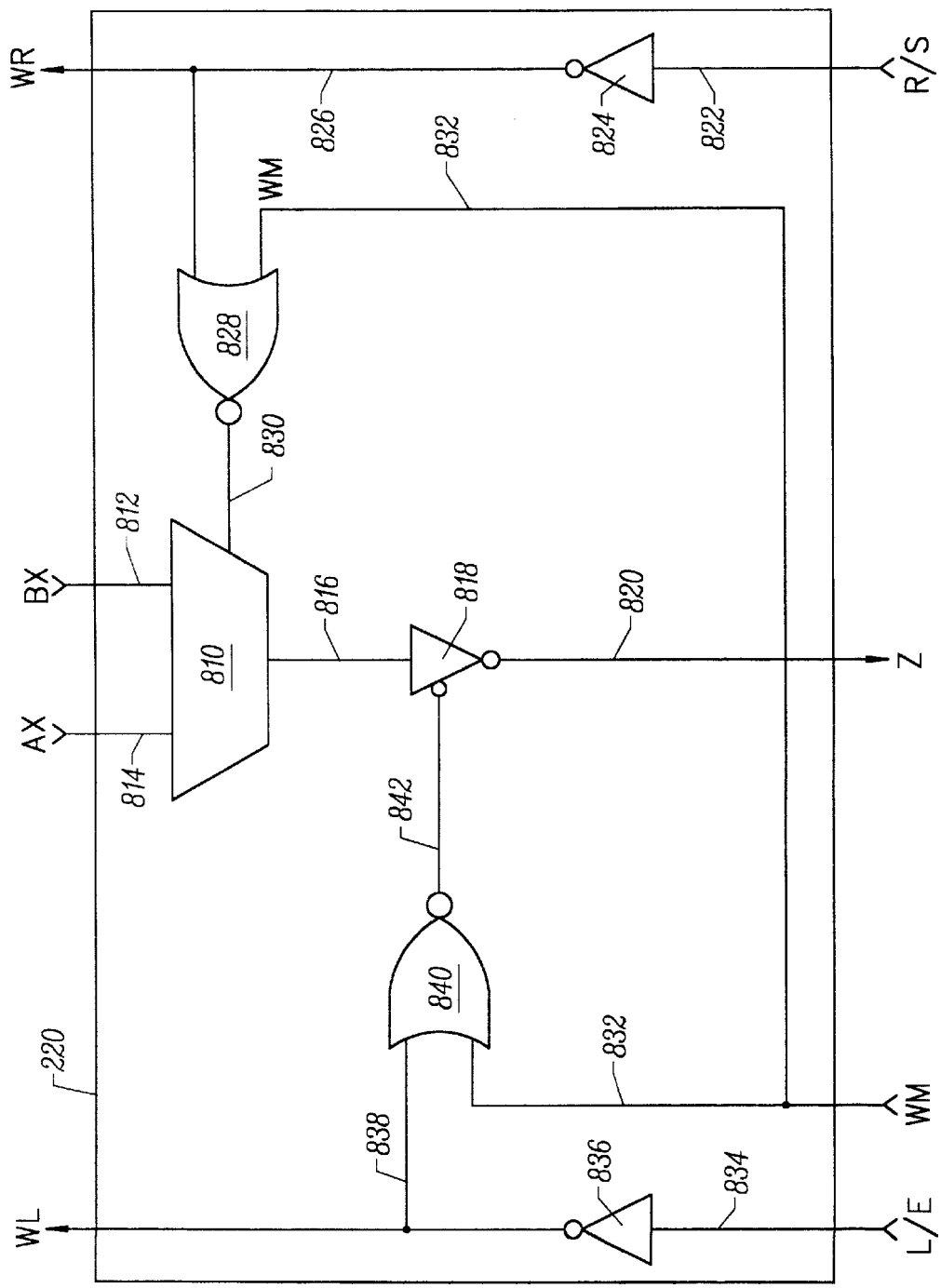
FIG. 7 is a functional block diagram of a second embodiment of a communication module in accordance with the invention.

An alternative embodiment of communication module 220 is shown in FIG. 7 and has fewer inputs than the embodiment of FIG. 5. Multiplexer 810 receives input AX on line 814 and BX on line 812. Multiplexer 810 is coupled via output line 816 to tri-state inverter 818. The output of tri-state inverter 818 is output signal Z on line,820. An R/S signal is input to module 220 on line 822 into inverter 824. The output 826 of inverter 824 serves as an output of signal WR from module 220 and is also an input into NOR gate 828. The second input into NOR gate 828 on line 832 is coupled to signal WM, an input to module 220. The output of NOR gate 828 is coupled to multiplexer 810 via select line 830. Signal L/E is input to communication module 220 on line 834 and is received as an input by inverter 836. The output of inverter 836 is output WL from module 220 and is also coupled via line 838 to NOR gate 840. The second input of NOR gate 840 is WM on line 832. The output of NOR gate 840 is coupled via line 842 to the enable input of tri-state inverter 818.

Figure 8:
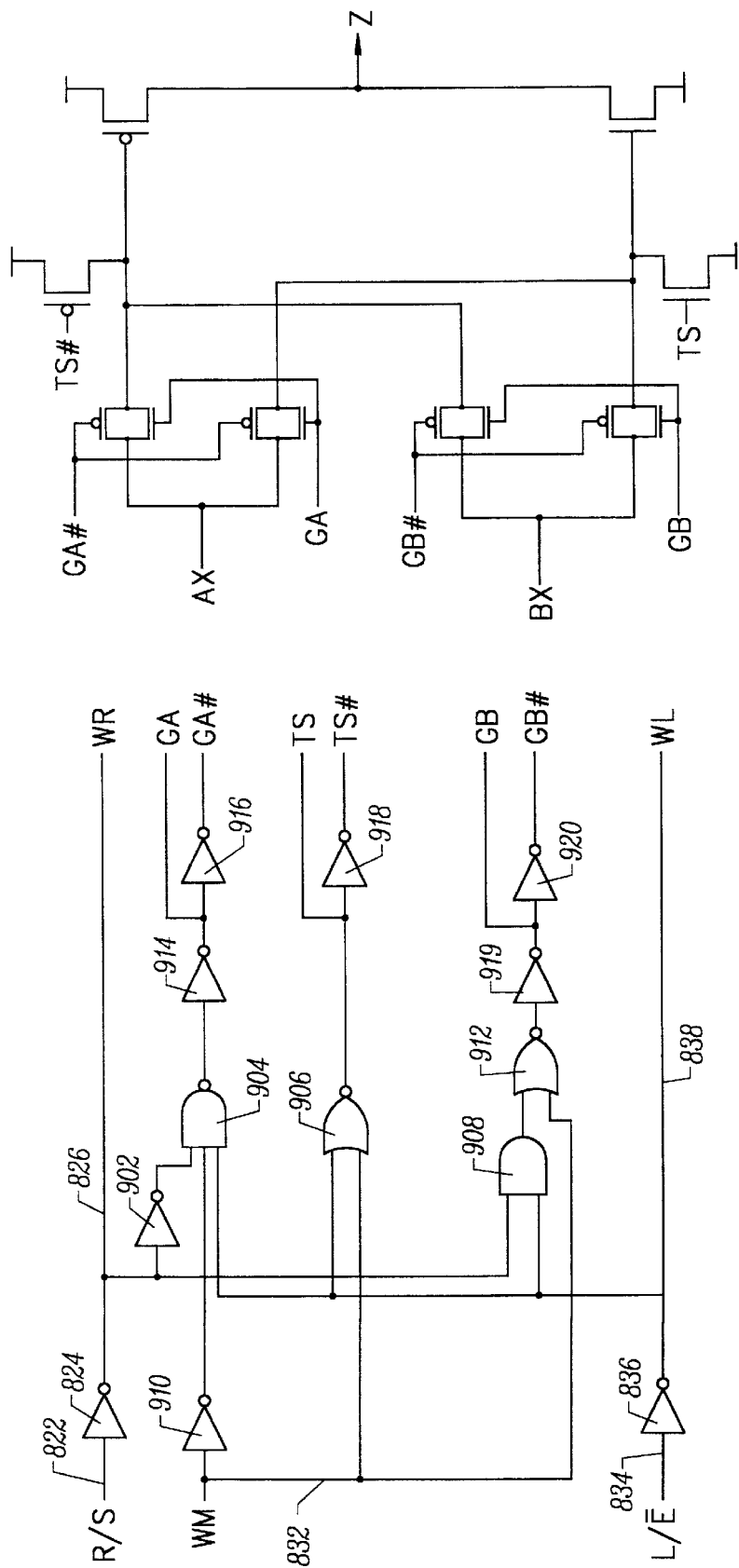
FIG. 8 is a schematic diagram of the embodiment of a communication module shown in FIG. 7.

Shown in FIG. 8 is a specific implementation of the embodiment of communication module 220 shown in FIG. 7. The implementation of the multiplexer and tri-state inverter are the same as that shown and discussed with reference to FIG. 6. However, distinct from FIG. 6, R/S is input on line 822 to inverter 824, which outputs signal WR on line 826. Line 826 is further coupled to the input of inverter 902 whose output is coupled to the input of NAND gate 904. Line 826 is also coupled to the input of AND gate 908.

L/E is input on line 834 to inverter 836, which outputs signal WL on line 838. Line 838 is also coupled to a second input of NAND gate 904 as well as to a second input of AND gate 908 and a first input of NOR gate 906.

WM is input on line 832, which is coupled to inverter 910. The output of inverter 910 is coupled to a third input of NAND gate 904. Line 832 is further coupled to a second input of NOR gate 906 as well as a first input of NOR gate 912. The second input to NOR gate 912 is received from the output of AND gate 908.

The output of NAND gate 904 is coupled to inverter 914, whose output forms the signal GA and is also coupled to inverter 916. The output of inverter 916 forms a signal GA#. The output of NOR gate 906 forms output TS and is also coupled to inverter 918, whose output forms signal TS#. The output of NOR gate 912 is coupled to inverter 919, whose output forms a signal GB and is also coupled to inverter 920. The output of inverter 920 forms a signal GB#.

Figure 9:
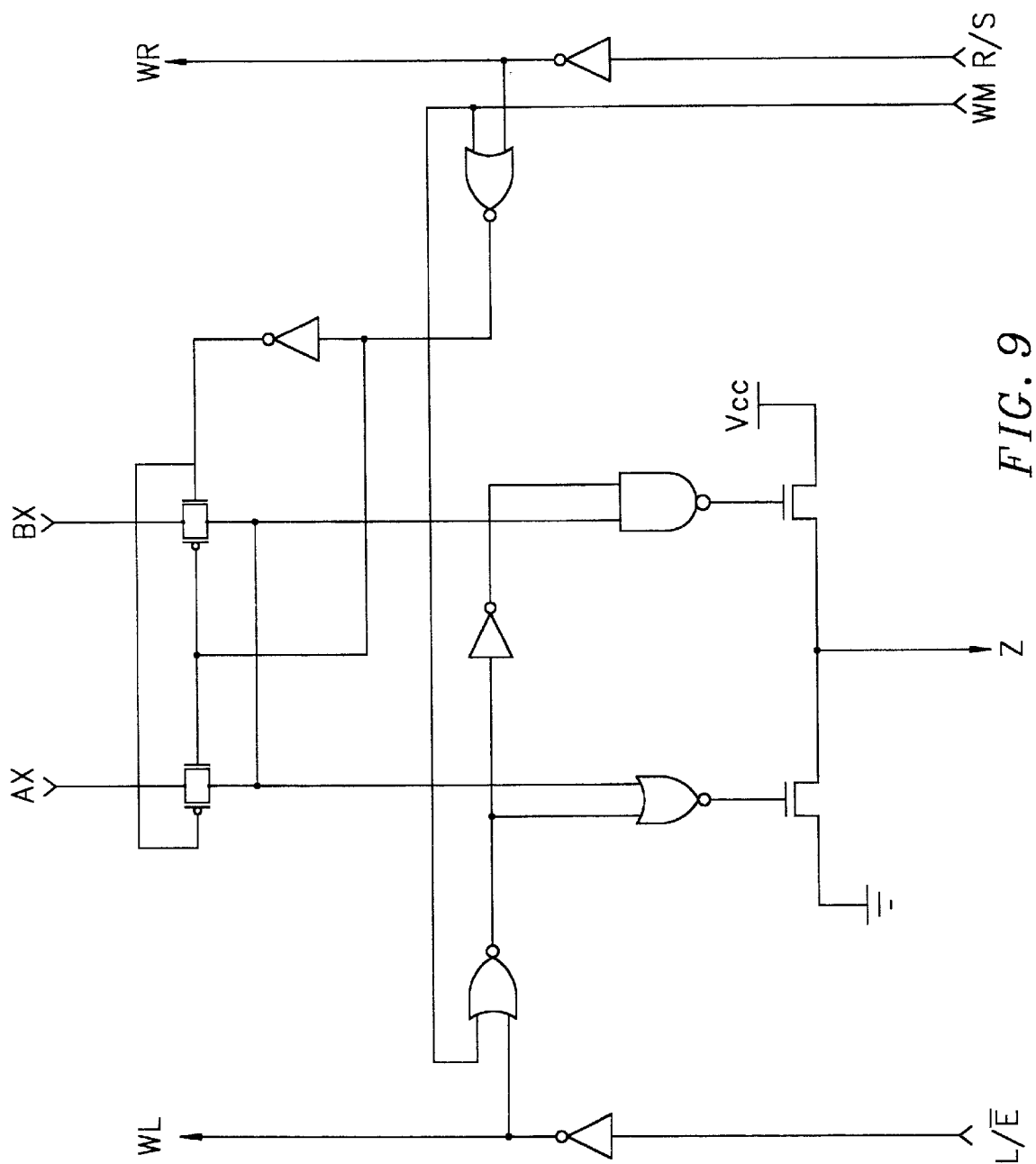
FIG. 9 is a schematic diagram of a third embodiment of a communication module in accordance with the invention.

FIG. 9 shows still another embodiment of communication module 220.

Figure 10:
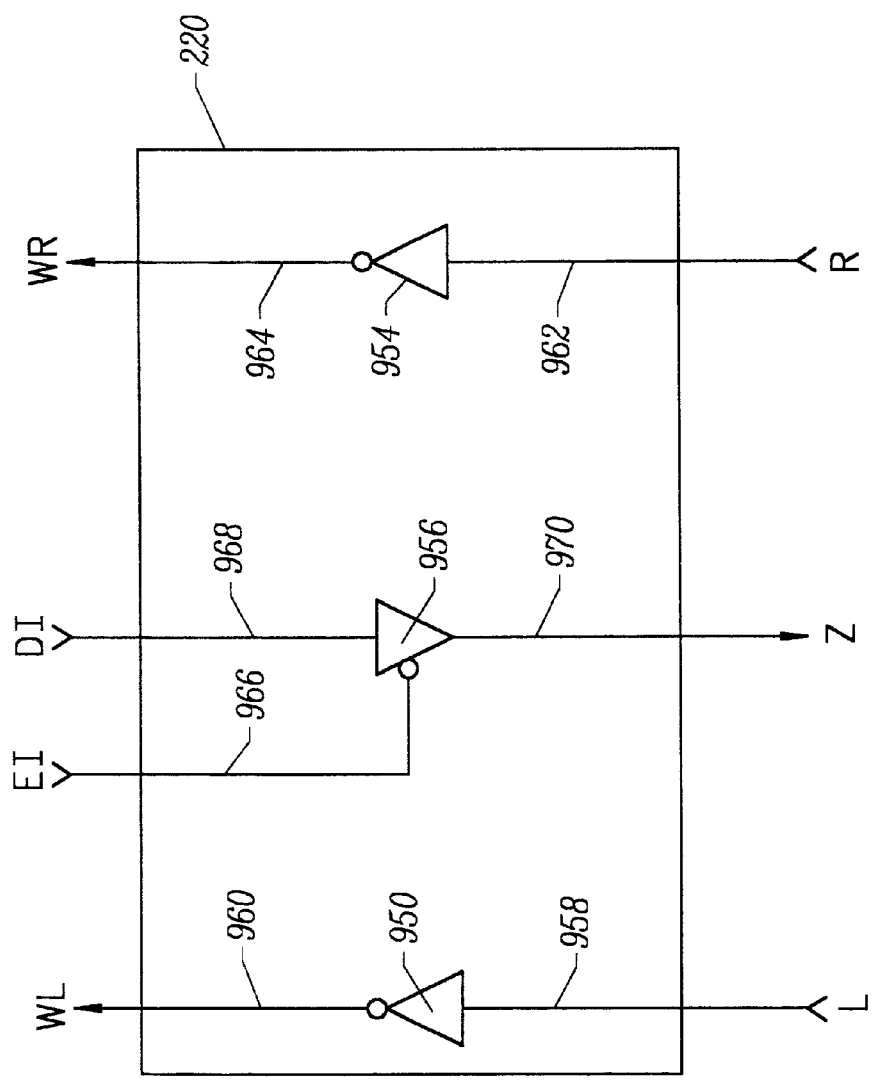
FIG. 10 is a functional block diagram of a fourth embodiment of a communication module in accordance with the invention.

FIG. 10 shows still another embodiment of communication module 220. The embodiment of FIG. 10, however, since it lacks the multiplexing capability, is more compact than those of FIGS. 5–9, having fewer inputs and fewer functional elements, and includes inverters 950 and 954 and tri-state buffer 956. Inverter 950 receives input signal L on line 958 and produces output signal WL on line 960. Inverter 954 receives input signal R on line 962 and produces output signal WR on line 964. Tri-state buffer 956 receives signal DI as an input on line 968 and produces signal Z on line 970. Tri-state buffer 956 further receives signal EI to its enable input on line 966.

Figure 11:
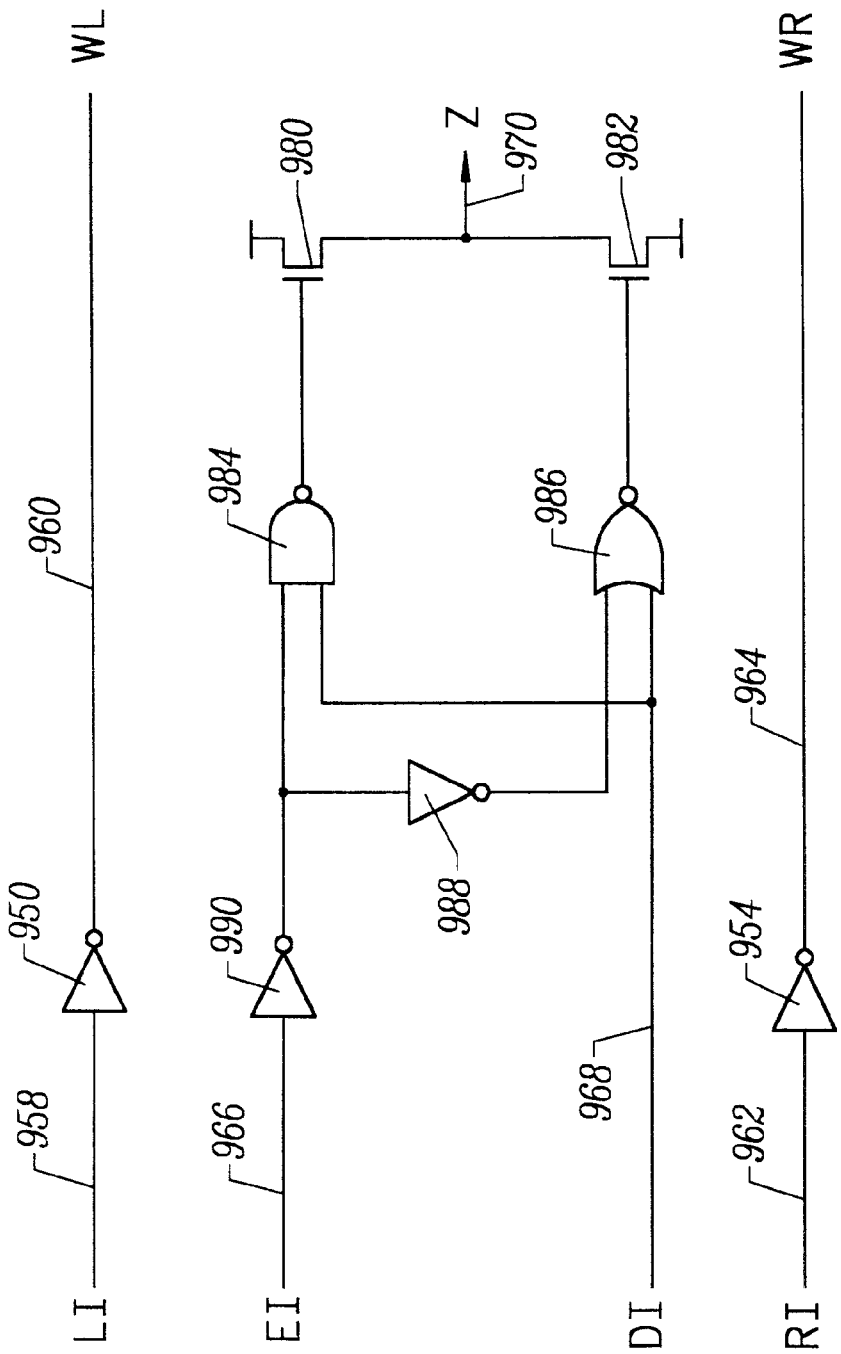
FIG. 11 is a schematic diagram of the embodiment of a communication module shown in FIG. 10.

FIG. 11 is a schematic drawing showing a specific implementation of the embodiment of communication module 220 shown in FIG. 10. Tri-state buffer 956 is implemented with p-channel transistor 980, n-channel transistor 982, NAND gate 984, NOR gate 986, and inverters 988 and 990. Signal EI is input to inverter 990 whose output is coupled to one input of NAND gate 984 and to inverter 988. The output of inverter 988 is coupled to one input of NOR gate 986. Input signal DI on line 968 is coupled to the second input of NAND gate 984 and the second input of NOR gate 986. The output of NAND gate 984 is coupled to the gate of transistor 980. The output of NOR gate 986 is coupled to the gate of transistor 982. The drain of transistor 980 is coupled to the drain of transistor 982, forming output Z on line 970.

With respect to FIGS. 5–11, while various logic gates are shown, a person of ordinary skill in the art will recognize that a number of other gate combinations are possible to achieve similar functionality.

Modes of Operation

A function block described with respect to FIGS. 2–11 can be configured to implement a number of modes of operation by simply varying the input signals to the various modules, e.g., by trying various inputs to a logical high signal, a logical low signal, a module output, or an off-chip signal. As used herein, "logical low" refers to a "0" signal, which in some embodiments is a ground signal. A "logical high" refers to a "1" signal, which in some embodiments is a $V_{DD}$ signal. The modes of operation include combinational, sequential, memory, mixed and other modes, which will be described below with reference to several examples.

Combinational Modes of Operation

Computational module 210 in the embodiment shown in FIG. 3 can be configured in millions of ways by simply varying the module's input signals. In fact, over 300 of the functions so formed are clearly useful to IC designers. These functions can be implemented using stage one 310 alone, using stage two 320 alone, or using both stages together.

Figure 12:
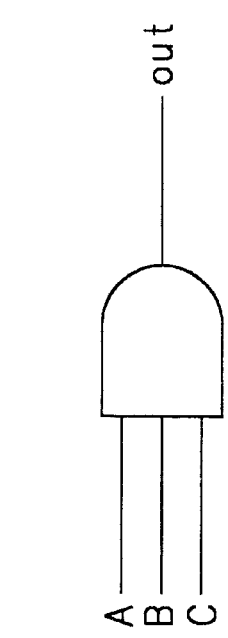
FIG. 12 is a block diagram of a 3-input AND gate.

For example, the 3-input AND gate shown in FIG. 12 can be implemented using stage one 310 of computation module 210. Signal A is coupled to input D3, signal B is coupled to input S1, and signal C is coupled to signal S0. Inputs D0, D1, and D2 are each coupled to a logical low signal. The output of the AND gate is P on line 348.

Figure 13:
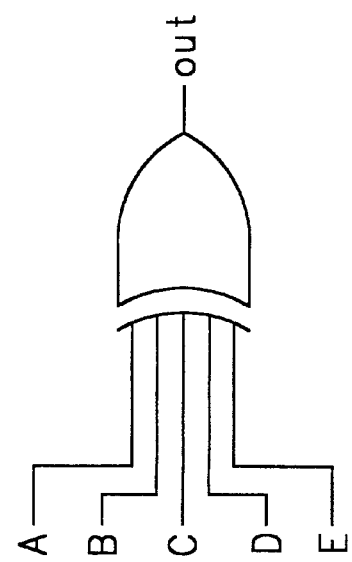
FIG. 13 is a block diagram of a 5-input XOR gate.

Another example is the five input XOR gate shown in FIG. 13. The 5-input XOR gate can be implemented by coupling a signal A to inputs D1 and D2 of computation module 210. An inverted signal A is coupled to the inputs D0 and D3. An inverter to invert signal A can be obtained from the communication module, and such use will be described in further detail below. A signal B is coupled to input S1 while signal C is coupled to input S0. Output signal P is coupled to input signals DA and DS. Input MC is tied to a logical low signal while inputs AS and SC are tied to a logical high. The D input is coupled to the EN input and the S2 input. Finally, the E input of the XOR gate is coupled to the SX input of the computation module. When configured in this manner, stage one 310 serves as a 3-input XOR gate whose output, P, is one input into a second 3-input XOR gate, implemented by stage two 320 and whose output is Q. Thus a 5-input XOR gate is implemented, having Q on line 402 as the function output.

Computation module 210 can also implement a full adder. A full adder is a function having three inputs, A, B, and C, and having two outputs, one representing the sum of the inputs and the second representing a carry bit. A function table for a full adder is given in Table 1 below:

TABLE 1

| A | B | C | Carry Bit | Sum Bit |
|---|---|---|-----------|---------|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

Referring again to FIG. 3, to implement a full adder the D0 input of the computation module is tied to a logical low while D3 is pulled to a logical high signal. Signal A is applied to inputs D1 and D2. The S1 input receives signal B while S1 receives signal C. The P output represents the carry bit output of the full adder. In this configuration, stage one 310 is also equivalent to a majority function for A, B and C (a function whose output represents the majority of the bits input).

In the second stage of the computation module, signal A is coupled to both the DA and DS inputs while B is coupled to EN as well as S2. C is coupled to the SX input. MC is tied to a logical low while AS and SC are tied to a logical high signal. The Q output from a computation module configured in this manner will represent the binary sum bit of the full adder. The second stage configured in this manner is also equivalent to a 3-input XOR gate.

Figure 14:
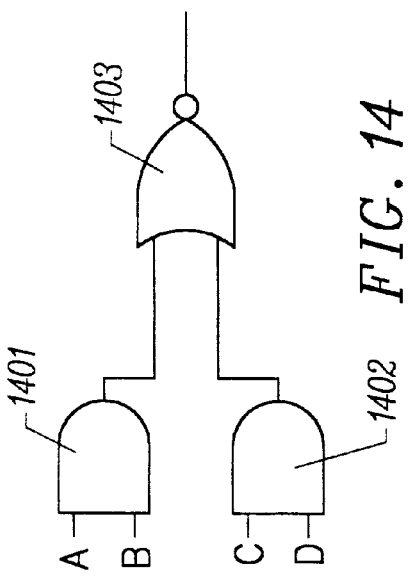
FIG. 14 is a block diagram of two 2-input AND gates whose outputs are coupled to the inputs of a 2-input NOR gate.

To implement the function shown in FIG. 14 (two 2-input AND gates whose outputs are coupled to the inputs of a 2-input NOR gate), the computation module is configured with stage one 310 implementing AND gate 1401 and stage two 320 implementing AND gate 1402 and NOR gate 1403. Signal A is coupled to input S0 and signal B is coupled to S1, while D0, D1, and D2 are tied to a logical high signal and D3 to a logical low signal. The output P of stage one 310 is coupled to input SX. Signal C is coupled to input EN and signal D is coupled to AS, while DA, DS, MC, SC, and S2 are all tied to a logical low signal. Output Q from stage two 320 is the output of the function shown in FIG. 14.

Thus, as can be seen, a variety of combinational functions are available using a computation module 210. Additionally, multiple complex functions can be implemented when multiple computation modules are used together.

Sequential Modes of Operation

Those with skill in the art will recognize that in each of the above combinational examples, the inverters 374 and 392 are disabled and/or overdriven and will thus not effect the function of the circuit shown in FIG. 3. In order to implement sequential modes of operation, however, these inverters are utilized.

Figure 15:
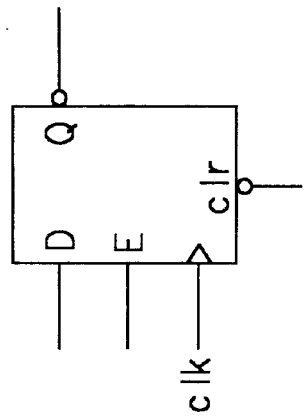
FIG. 15 is a block diagram of a flip-flop.

To implement computation module 210 as the D-type flip-flop of FIG. 15, computation module 210 is configured with its inputs in the following manner. The data input (D) of FIG. 15 is applied to input DS. The output Q from the computation module 210 is also the output Q of the flip-flop shown in FIG. 15. A clock signal (CLK) is applied to input MC and SC. An enable signal is applied to input EN. A clear signal or a preset signal is applied to inputs AS and S2. DA is connected to a logical low for a clear signal or to a logical high for a preset signal. SX is tied to a logical low.

In this manner, a data bit input at DS will pass serially through bit storage unit 370 and bit storage unit 388, and the implementation acts as a master-slave configuration.

When bit storage units 370 and 388 are implemented with cross-coupled inverters in an embodiment of the invention, inverters 372 and 390 should be stronger than inverters 374 and 392, respectively. Thus, when the input data from the multiplexer to the bit storage unit changes states (e.g., 0 to 1), the input data will overdrive inverter 374 and/or inverter 392. When switch 361 opens (on a high clock signal), the cross-coupled inverters of bit storage unit 370 remain undisturbed and hold the last bit stored. In like manner, when switch 381 opens, the cross-coupled inverters of bit storage unit 388 remain undisturbed and hold the last bit stored.

A latch can be implemented in a similar manner, but only one bit storage unit needs to be utilized in such a mode of operation. In either the flip-flop or latch cases, the inputs are configured in such a way that multiplexer 396 always selects the input from line 394 to pass to output line 398.

Stage one 310 of computation module 210 is unused as described for purely sequential modes of operation. Stage one 310 may be used, however, in various configurations, i.e., mixed modes of operation, to implement combinational logic preceding or subsequent to sequential logic or as combinational logic separate from stage two.

Memory Mode of Operation

Unlike in a sequential mode of operation where, for instance with D-type flip-flops, bits stored in bit storage units 370 and 388 are accessed serially, in a memory mode of operation, bits stored in bit storage units 370 and 388 are accessed directly, or randomly. Direct access allows two bits, each one from a different word, to be stored and accessed in computation module 210.

To implement an SRAM cell, the computation module 210 of FIG. 3 is configured in the following manner to form a 2-port, 2-bit SRAM cell. A write bit line is coupled to the DA and the DS inputs of stage two 320. A first write word line, Write Word Line 0 (WWL0), is coupled to input MC. A second write word line, Write Word Line 1 (WWL1), is coupled to the S2 input. Write Word Line 0 controls the writing of a bit into bit storage unit 370 while Write Word Line 1 controls the writing of a bit into bit storage unit 388. A Read Address Bit 0 signal, which selects which bit will be read from the SRAM cell, i.e., the bit from storage unit 370 or the bit stored in storage unit 388, is applied to SX. EN and AS inputs are tied to a logical high while SC is tied to a logical low signal. The Q output of stage two is then input to communication module 220, further discussed below.

In an SRAM implementation, all three modules in function block 120 are useful. If both computation modules are configured as discussed above, four SRAM bits, each of a different word (or row), can be stored in a function block 120. Each of the two Q outputs of the computation modules 210.1 and 210.2 is coupled to communication module 220. In the embodiment of communication module 220 shown in FIG. 7, the Q output from module 210.1 is coupled to AX input 814 of computation module 220, while the Q output from computation module 210.2 will be coupled to BX input line 812. A second read address signal, Read Address Bit 1, is used to select which bit (the one selected from module 210.1 or the one selected from module 210.2) is to be output from multiplexer 810. Read Address Bit 1 is applied to R/S input 822. WM on line 832 is coupled to a logical low signal, making NOR gate 828 behave as an inverter. Inverter 818 is enabled by applying an enable signal, Read Word Line, to L/E on line 834. Because WM is tied to ground, NOR gate 840 will also behave as an inverter. Thus, multiplexer 810 and tri-state inverter 818 act as an SRAM tri-state driver, driving one of four SRAM bits onto line 820.

Figure 16:
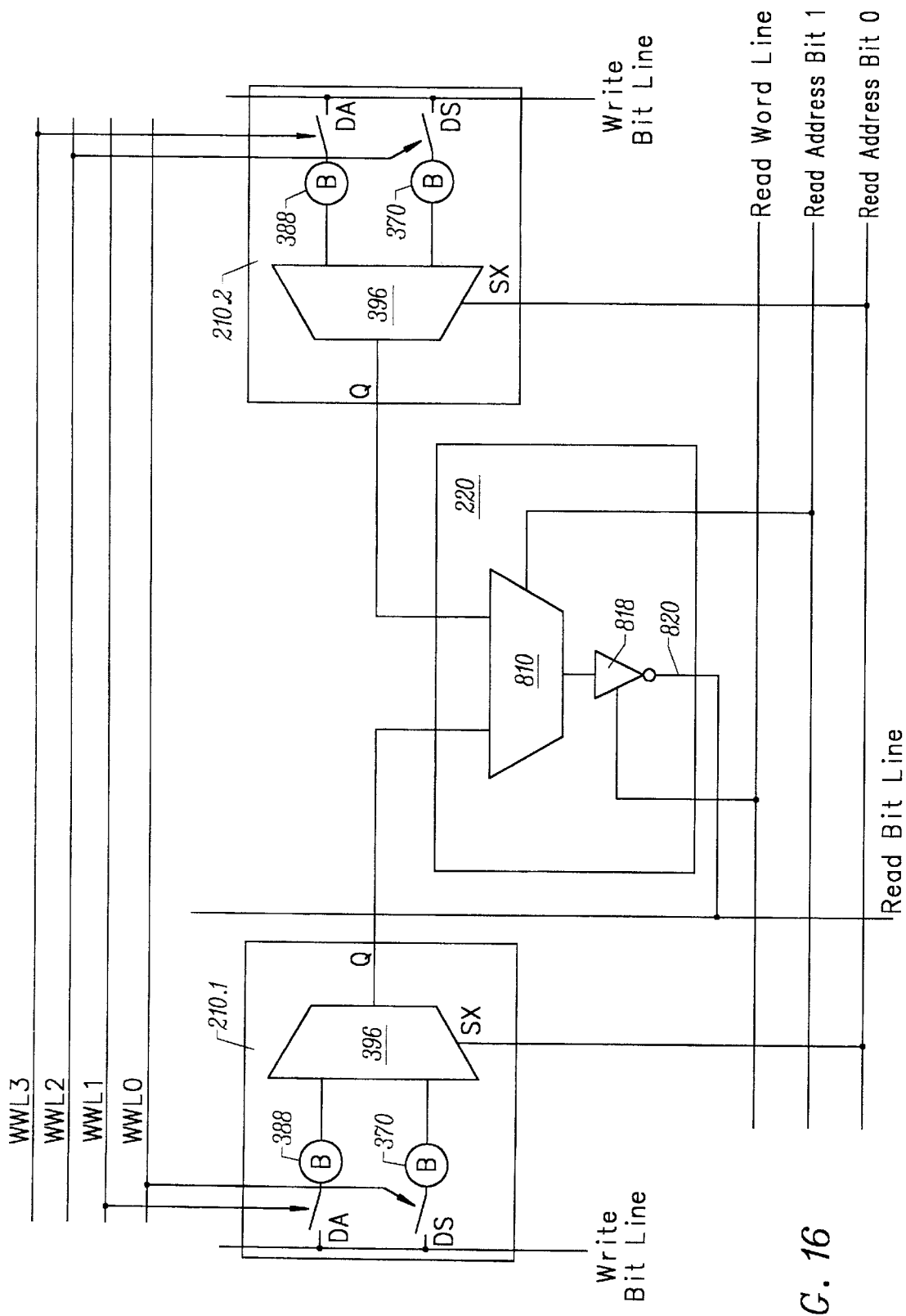
FIG. 16 is a functional, simplified block diagram of two computation modules coupled to an embodiment of a communication module (shown in FIG. 7) to operate as a 4-bit SRAM cell in accordance with the invention.

The resulting effective (and simplified) circuit of a function block utilizing an embodiment of communication module 220 shown in FIG. 7 and configured in an SRAM mode of operation is shown in FIG. 16, where an encircled "B" represents a bit stored in a bit storage unit.

Figure 17:
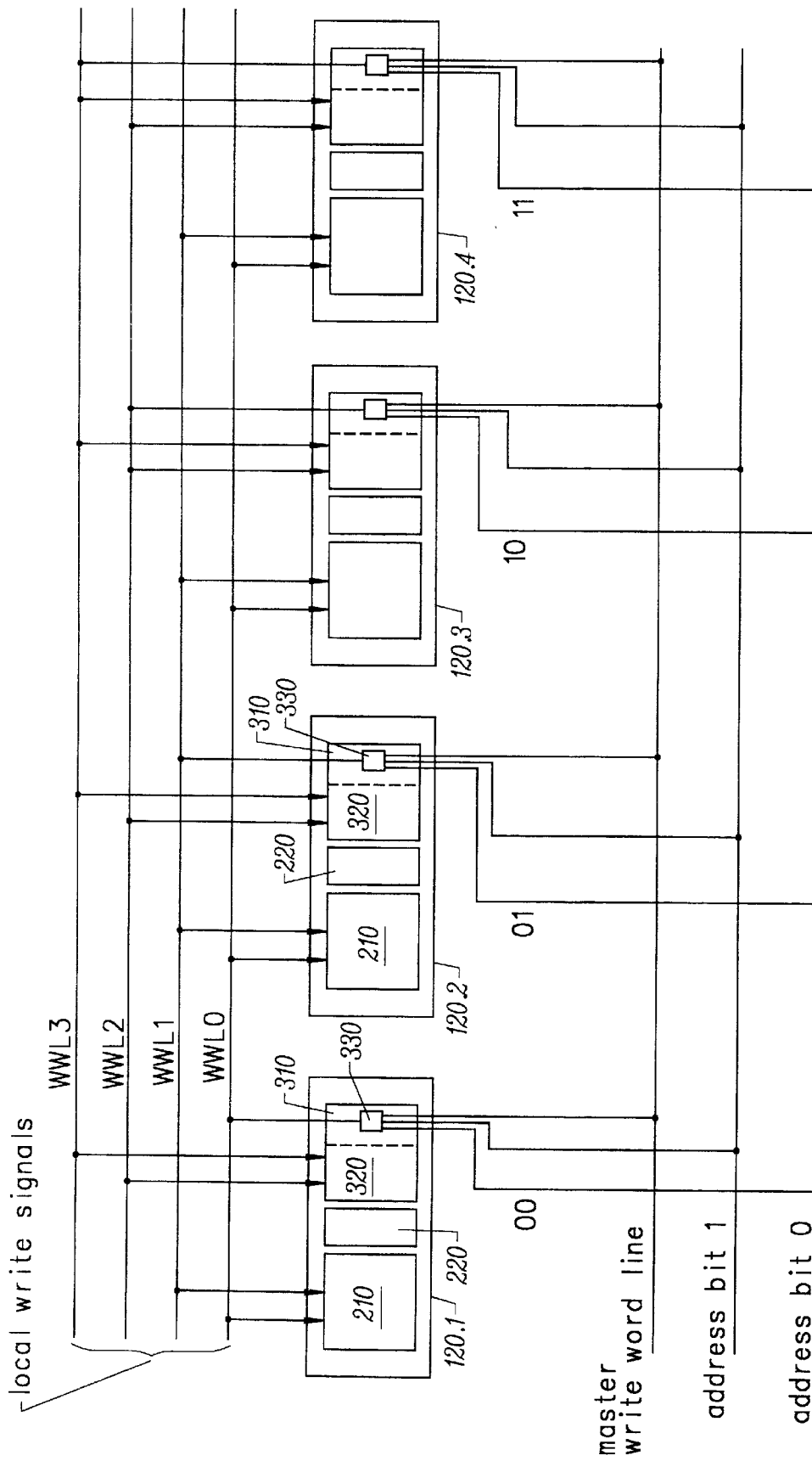
FIG. 17 is a functional, simplified block diagram of a portion of a gate array in accordance with the invention where the function blocks shown are coupled to operate in a memory mode of operation and where some of the multiplexers available in stage one of some computation modules in accordance with the invention are coupled to operate as write word line decoders.

As shown in FIG. 16, four write lines run horizontally through each SRAM row in an SRAM array, where one of each of the four write lines is for each of the four bits in the function block. As described so far, stage one 310 of computation module 210 is unused in the memory mode of operation for embodiments utilizing the communication module of FIG. 7. However, as shown in FIG. 17, these unused stage ones can be used to decode address bits 1 and 0 and generate local write word lines for each SRAM row from one master write word line in each row. For instance, when the master write word line is active, address bit 1 is "0", and address bit 0 is "1", then stage one 310 of function block 120.2 produces an active signal on Write Word Line 1 (WWL1). Using stage ones in such manner reduces the number of strong drivers required at the edge of an SRAM bit array. Moreover, this same structure for local write word line generation can also be used to support separate writable logical subwords (e.g., bytes) in the single physical word that spans the SRAM row.

The embodiment of communication module shown in FIG. 5 can be utilized in a similar manner to that shown in FIG. 7 and described above for memory modes of operation. One difference between the implementation of an SRAM driver in FIG. 5, however, is that some different logic will need to be utilized to provide E0 and E1, instead of L/E and R/S the ability to select the bit input for multiplexer 510 and control the tri-state output of inverter 518. Such additional logic, however, is easily absorbed into SRAM control logic implemented in a separate function block 120.

Figure 18:
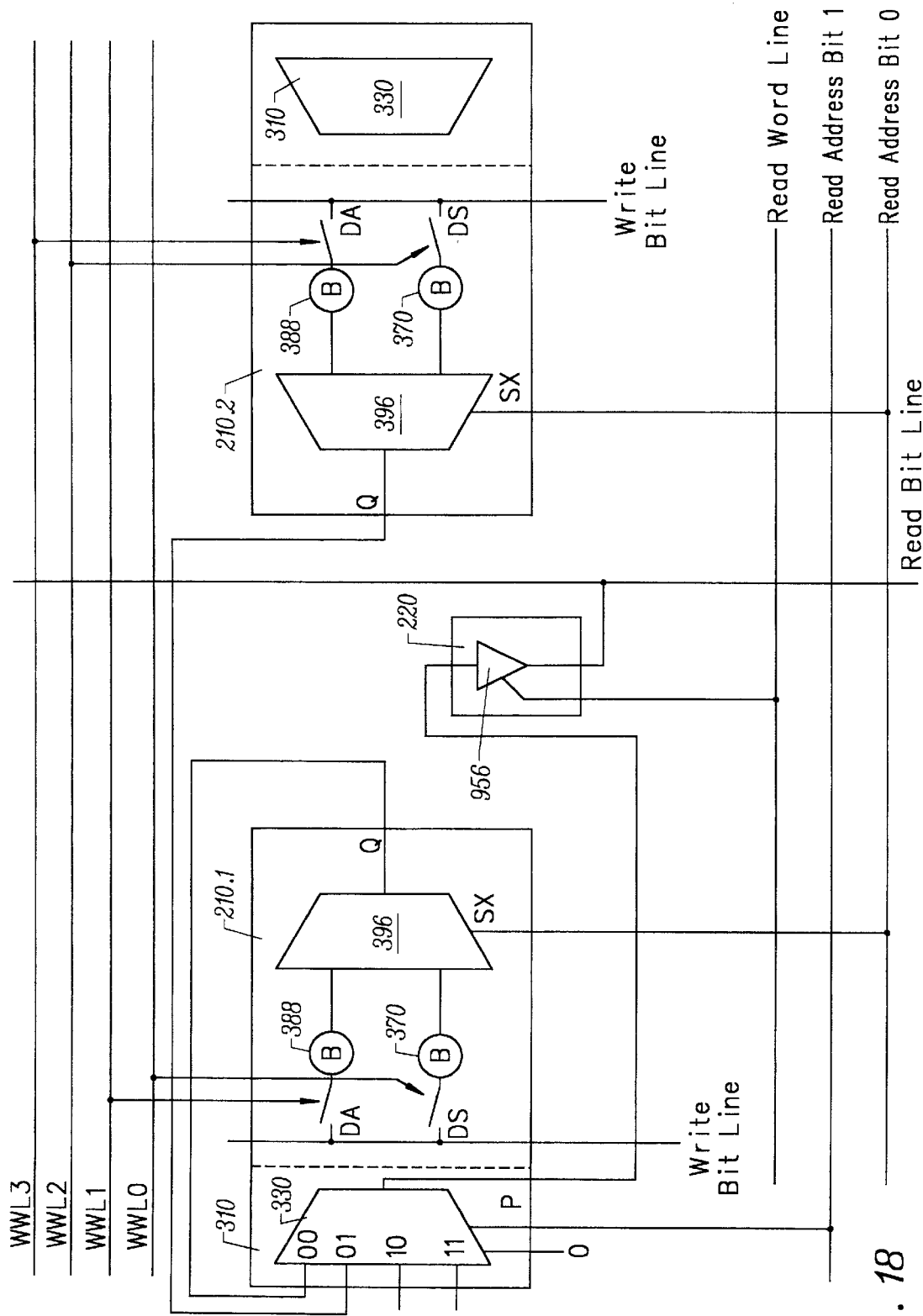
FIG. 18 is a functional, simplified block diagram of two computation modules in accordance with the invention coupled to an embodiment of a communication module (shown in FIG. 10) to operate as a 4-bit SRAM cell in accordance with the invention.

The embodiment of communication module 220 shown in FIG. 10 can also implement SRAM operations in a manner similar to that described with respect to the embodiment of FIG. 7. However, because communication module 220 of FIG. 10 lacks the multiplexer of the other embodiments, stage one 310 of one computation module 210 is used to support the multiplexing portion of the SRAM function. Thus, as shown in FIG. 18, stage one 310 of computation module 210.1 receives as inputs the Q output from each of modules 210.1 and 210.2. The output P from module 210.1 is then coupled to the tri-state buffer 956 of communication module 220 (FIG. 10). Stage one 310 of module 210.2 is unused, can be used for decoding functions as shown in FIG. 17, or can be used for other combinational logic. Moreover, since stage one 310 in module 210.1 can be used to multiplex between four inputs, only one read bit line is actually necessary for four function blocks. Thus, it should be recognized by those of skill in the art that if using the communication module structure of FIG. 10, a function block having four computation modules and one communication module may be beneficial.

Other Modes of Operation

In addition to an SRAM driver, communication module 220 also has several other modes of operation which will be useful to an IC designer. First, as will be clear to one of skill in the art from the above SRAM discussion, module 220 is useful for functioning as a tri-state driver. Use of the embodiment shown in FIG. 10 as a tri-state driver will be clear to those of skill in the art.

To operate the embodiment of FIG. 7 as a tri-state driver, WM is coupled to a logical low and a logical low is also applied to the R/S input on line 822. Thus, multiplexer 810 is forced to always select the input on line 812. When an enable signal is asserted, or driven to a logical low, on line 834, the tri-state driver is enabled. When an enable signal on line 834 is deasserted, or driven to a logical high, then line 820 is tri-stated. With respect to FIG. 7, primarily, the only difference in implementation between a tri-state driver and an SRAM driver is that the SRAM actively uses multiplexer 810.

To use the embodiment of FIG. 5 as a tri-state driver, E0 is tied to a logical low signal and WM is tied to a logical high signal. E1 acts as the enable signal for the tri-state driver.

Another mode of operation for communication module 220 is as a strong buffer and signal inverter. Again, use of the embodiment of FIG. 10 in such a mode of operation will be understood by those of skill in the art.

Figure 19:
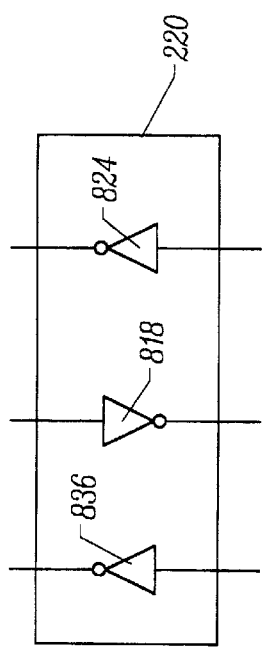
FIG. 19 is a functional, simplified block diagram of an embodiment of a communication module (shown in FIG.

To operate the embodiment of FIG. 7 as a strong buffer and signal inverter WM on line 832 is forced to a logical high signal so that inverter 818 will always be enabled, while multiplexer 810 will always select its input on line 812. Thus, the circuit effectively becomes three inverters as shown in FIG. 19. The inside inverter, inverter 818, acts as a strong buffer, as it is made from larger transistors and can generally drive more loads than inverters 824 and 836. However, inverters 824 and 836 are useful for inverting signals and thus increasing the functionality of computation module 210. Examples of use of inverted signals into computation module 210 are given in the combinational logic examples discussed previously.

To use the embodiment of FIG. 5 as a strong buffer, E0 and E1 are each tied to a logical high. The signal to be buffered is input on BX, line 512.

As discussed above, the embodiments of FIGS. 5 and 7 operate in a similar manner. A summary of their inputs and functions can be seen in the following Table 2:

TABLE 2

| FIG. 5 Inputs | | FIG. 7 Inputs | | |
|---|---|---|---|---|
| E0 | E1 | R/S | L/E | Function |
| 0 | 0 | 1 | 0 | pass through AX |
| 1 | 1 | 0 | 0 | pass through BX |
| 1 | 0 | X | 1 | tri-state |
| 0 | 1 | | | not used |

Still another mode of operation for communication module 220 is for clock-distribution. As discussed with reference to FIG. 1, the clock is globally distributed to gate array 100 through ports 140 from the clock trunk 130. However, when a clock signal is globally distributed, clock skew can become a problem. Using multiple communication modules 220 of the embodiment of FIG. 7 configured as shown in FIG. 20, communication modules can effectively form "tree leaves", which when judiciously located in the gate array can be an effective tool for distributing clocks and minimizing clock skew simultaneously. When used in this manner, simply reversing the constants tied to the inputs of the multiplexer further allows clock signal negation, also without skew. FIG. 21 shows a clock distribution mode of operation for the embodiment of communication module shown in FIG. 10.

Another effective use of communication module 220 is with respect to clock gating, such as that shown in FIG. 22. Clock gating also often creates clock skew due to additional delays through the extra gates. However, if communication module 220 (of FIG. 7) is configured as shown in FIG. 23 to replace the clock gating circuit 999 of FIG. 22, then skew from clock gating can be eliminated, particularly if the clock distribution scheme as discussed above with reference to FIG. 20 is also utilized. As will be understood by those of skill in the art, inputs to multiplexer 810 as shown in FIG. 23 can be varied according to the clock gating function. Similarly, if using function blocks having a communication module like that of FIG. 10, then stage one 310 of a computation module 210 is used in conjunction with a communication module 220 to replace clock gating circuit 999, as shown in FIG. 24.

In addition, communication module 220 is also useful for insuring the testability of certain difficult to test areas, such as internally generated clocks. FIG. 25 shows a ring oscillator which is used to clock a flip-flop. When testing a circuit having a ring oscillator, that portion of the circuit controlled by the ring oscillator is difficult to test because the clocks are not controllable from an outside input. Neither are these clock signals gated. Thus, by inserting and using the communication module of FIG. 7 as shown in FIG. 26 to replace inverter 1000 of FIG. 25, testing can more easily be implemented. In normal operation of the circuit in FIG. 26, TM will be coupled to a logical low, making communication module 220 transparent to the circuit. However, when testing the circuit, TM is set to a logical high and TC controls the clock, allowing a test clock to be input for test purposes. Similarly, when using function blocks having the communication module of FIG. 10, stage one 310 of computation module 210 is utilized instead, as shown in FIG. 27, to accomplish the same function.

With reference to FIGS. 24 and 27, providing the multiplexer 330 of stage one 310 of computation module 210 has further benefits. In circuits implemented on a gate array, various test logic is generally also added to test the circuits. Often this test logic is added into flip-flops, and allows for controlling and observing the circuit states during special test modes. Thus, in the function block described, test circuitry would likely be embedded in conjunction with stage two 320 of computation module 210, since it is capable of sequential modes of operation. However, if clock gating or generation were to be implemented in stage two using its combinational mode of operation, problems could arise when using the gated or generated clock during test. Specifically, if stage two has a normal mode of operation, in which it acts as a clock gating or generation circuit, and a test mode of operation, in which it outputs a controlled circuit state, then since in the test mode all the stage two outputs can only change simultaneously at the application of an entire test stimulus, the stage two outputs will be unable to produce usable clock edges during test. Thus, it is beneficial to provide secondary logic (e.g., either stage one or the multiplexer in the communication modules of FIG. 5 and FIG. 7) which contains no state-controlling test circuitry and which contains some minimal computational ability to at least handle the situations of FIGS. 24 and 27 (clock gating and internally generated clocks).

It should be clear from the above examples that communication module 220 can be extremely useful. Thus, in one embodiment of the invention, one communication module is provided for every two computation modules, thus forming the function block 120 of FIG. 2. Other embodiments of the invention, however, may provide a different ratio of computation to communication modules (e.g., 4:1). Further, it should be clear to one of ordinary skill in the art that each module shown in FIG. 2 as part of function block 120 can be used independently of one another, in conjunction with one another, or in conjunction with other function block modules in matrix 110.

Driver Strengths

As should be clear from the discussion of "Modes of Operation" above, driver strengths of the various outputs from the modules are also important. In one embodiment, the weak inverters in communication module 220 (e.g., inverters 836 and 824 in FIG. 7 or inverters 950 and 954 in FIG. 10) are designed to drive 2–3 computation module stage one or stage two inputs and have a channel width of approximately 3.6 $\mu$m. In most applications, stage one's 310 output will be required to drive on average 3–4 inputs. Thus, the transistors to drive the P output from stage one 310 of computation module 210 are approximately 1.5 times larger than the weak inverters of the communication module 220 and are approximately 5.4 $\mu$m. Since stage two 320 of computation module 210 often implements a sequential function, whose state is often needed by many other modules, it will frequently require a large fanout. Thus, transistors to drive the Q output from stage two 320 are two times larger than those to drive the stage one output and three times larger than the weak communication module inverters, i.e., approximately 10.8 $\mu$m. Finally, the transistors for the tri-state driver portion of communication module 220 (e.g., tri-state inverter 818 of FIG. 7 or tri-state buffer 956 of FIG. 10) are eight times larger than the weak communication module inverters, having approximately 28.8 $\mu$m wide channels.

One advantage of the invention is that to customize the array, only minimal masking steps need be utilized. That is, because the function block's circuit is predefined with fixed internal interconnections, only the user-defined inter-function block connections need be placed to define the function block and/or module functions. Thus, customization time of a gate array in accordance with the invention can be minimized. Of course, other embodiments of the invention may be in the form of FPGAs (i.e., where customization is done by programming RAMs or melting fuses). However, FPGAs will tend to be bulkier if the same numbers of function blocks are used than a gate array which places the final user-defined interconnections using mask steps.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A logic module, comprising:
   a plurality of inputs, where each input is generally for receiving a respective input signal;
   a logic circuit configurable to operate in one of multiple modes of operation including a combinational mode of operation and a sequential mode of operation, wherein said logic circuit is configured to operate in a combinational mode of operation by applying a first set of input signals to said plurality of inputs and to operate in a sequential mode of operation by applying a second set of input signals to said plurality of inputs, wherein said logic circuit includes a first bit storage unit selectively configurable to store a first bit and a second bit storage unit selectively configurable to store a second bit, wherein in said combinational mode of operation said first bit storage unit and said second bit storage unit are configured to operate as combinational logic, and wherein in said sequential mode of operation at least one of said first bit storage unit and said second bit storage unit are configured to store a bit.

2. The logic module of claim 1, further comprising an output for carrying a combinational output signal in said combinational mode of operation and a sequential output signal in said sequential mode of operation, and wherein a first one of said plurality of inputs is for receiving a combinational input signal in said combinational mode of operation and a data input signal in said sequential mode of operation.

3. The logic module of claim 2, wherein said logic circuit is configured to operate in a memory mode of operation by applying a third set of input signals to said plurality of inputs, and wherein said first one of said plurality of inputs is further for receiving a memory write signal in said memory mode of operation, and wherein said output is further for carrying a read data signal in said memory mode of operation.

4. The logic module of claim 3, wherein a second one of said plurality of inputs is for receiving a combinational input signal in said combinational mode of operation, an asynchronous load data signal in said sequential mode of operation, and a memory write signal in said memory mode of operation.

5. The logic module of claim 1, wherein in a first mode of operation said first bit storage unit and said second bit storage unit are accessed serially, and wherein in a second mode of operation said first bit storage unit and said second bit storage unit are accessed independently.

6. The logic module of claim 5, wherein in said second mode of operation said first bit storage unit and said second bit storage unit are accessed independently and simultaneously.

7. The logic module of claim 5, wherein said first mode of operation is said sequential mode of operation and said second mode of operation is a memory mode of operation.

8. The logic module of claim 1, wherein combinational logic includes a buffer.

9. A logic module, comprising:

a plurality of transistors coupled to form a logic circuit configurable to operate in one of multiple modes of operation including a combinational mode of operation, a sequential mode of operation, and a memory mode of operation;

wherein a first set of transistors in said plurality of transistors is selectively configurable to operate as a first bit storage unit to store a first bit of information and wherein a second set of transistors in said plurality of transistors is selectively configurable to operate as a second bit storage unit to store a second bit of information, wherein in said combinational mode of operation said first set of transistors and said second set of transistors are configured to operate as combinational logic, wherein in said sequential mode of operation at least one of said first set of transistors and said second set of transistors are configured to store a bit, and wherein in a first mode of operation said first bit and said second bit are accessed directly and in a second mode of operation said first bit and said second bit are accessed serially;

a plurality of inputs, where each input is generally for receiving a respective input signal to selectively configure said plurality of transistors to operate in one of said multiple modes of operation; and an output.

10. The logic module of claim 9, wherein:

a first one of said plurality of inputs receives a combinational input signal in said combinational mode of operation, a data input signal in said sequential mode of operation, and a memory write signal in said memory mode of operation; and a second one of said plurality of inputs receives a combinational input signal in said combinational mode of operation, an asynchronous load signal in said sequential mode of operation, and a memory write signal in said memory mode of operation.

11. The logic module of claim 10, wherein:

said output carries a combinational output signal in said combinational mode of operation, a sequential output signal in said sequential mode of operation, and a read data signal in said memory mode of operation.

12. The logic module of claim 11, wherein in a sequential mode of operation said first bit and said second bit are accessed serially, and in a memory mode of operation said first bit and said second bit are accessed independent.

13. The logic module of claim 12, wherein said first set of transistors and said second set of transistors are each coupled to form a pair of cross-coupled inverters, wherein one of said inverters in each pair has an enable input.

14. The logic module of claim 13, wherein a third set of transistors in said plurality of transistors are coupled to form a plurality of multiplexers.

15. A logic module comprising:

a first multiplexer having a first data input, a second data input, a first control input, a second control input, and an output;

a first bit storage unit having an input coupled to said output of said first multiplexer and having an output;

a second multiplexer having a first data input, a second data input coupled to said output of said first bit storage unit, a first control input, a second control input, and an output;

a second bit storage unit having an input coupled to said output of said second multiplexer and having an output coupled to said second data input of said first multiplexer;

a third multiplexer having a first data input coupled to said output of said second bit storage unit, a second data input coupled to said output of said first bit storage unit, a control input, and an output;

an output buffer coupled to said output of said third multiplexer;

select and enable logic coupled to said first control input of said first multiplexer, said second control input of said first multiplexer, said first control input of said second multiplexer, and said second control input of said second multiplexer.

16. The logic module of claim 15, further comprising:

a fourth multiplexer having four data inputs, two control inputs, and an output;

a second output buffer coupled to said output of said fourth multiplexer.

17. The logic module of claim 15, wherein:

said first bit storage unit and said second bit storage unit each include a pair of cross-coupled inverters; and said output buffer is an inverter.

18. The logic module of claim 17, wherein application of a first signal to said first data input of said first multiplexer, a second signal to said first data input of said second multiplexer, a third signal to said control input of said third multiplexer, a fourth signal to an input of said select and enable logic configures said logic module to operate in one of multiple modes of operation, where said multiple modes of operation include a combinational mode of operation, a sequential mode of operation, and a memory mode of operation.

19. A function block, comprising:

a first configurable computation module having a first plurality of inputs, where each input in said first plurality of inputs is generally for receiving a respective input signal, and a first logic circuit configurable to operate in one of first multiple modes of operation including a combinational mode of operation and a sequential mode of operation, wherein said first logic circuit is configured to operate in a combinational mode of operation by applying a first set of input signals to said plurality of inputs and to operate in a sequential mode of operation by applying a second set of input signals to said plurality of inputs, wherein said first logic circuit includes a first bit storage unit selectively configurable to store a first bit and a second bit storage unit selectively configurable to store a second bit, wherein in said combinational mode of operation said first bit storage unit and said second bit storage unit are configured to operate as combinational logic, and wherein at least one of said first bit storage unit and said second bit storage unit are configured to store a bit in said sequential mode of operation; and a configurable communication module having a second plurality of inputs, where each input of said second plurality of inputs is generally for receiving a respective input signal, and having a second logic circuit configurable to operate in one of second multiple modes of operation, wherein said second logic circuit is configured to operate in a tri-state driver mode of operation by applying a third set of input signals to said second plurality of inputs and to operate in a buffer mode of operation by applying a fourth set of input signals to said second plurality of inputs, and wherein in at least one of said first multiple modes of operation and in at least one of said second multiple modes of operation said first configurable computation module is coupled to said configurable communication module.

20. The function block of claim 19, wherein said first logic circuit is configured to operate in a memory mode of operation by applying a fifth set of input signals to said first plurality of inputs.

21. The function block of claim 20, further comprising a second configurable computation module similar to said first configurable computation module.

22. The function block of claim 20, wherein said first configurable computation module includes a first output and said configurable communication module includes a second output and wherein:
 a first one of said first plurality of inputs is for receiving a combinational input signal in said combinational mode of operation, a data input signal in said sequential mode of operation, and a memory write signal in said memory mode of operation;
 said first output is for carrying a combinational output signal in said combinational mode of operation, a sequential output signal in said sequential mode of operation, and a read data signal in said memory mode of operation;
 a first one of said second plurality of inputs is for receiving an input signal in each of said tri-state driver and buffer modes of operation; and
 said second output is for carrying an output signal from each of said tri-state driver and buffer modes of operation.

23. The function block of claim 22, wherein in said memory mode of operation of said first configurable computation module, said first output is coupled to said first one of said second plurality of inputs, wherein said communication module is in a tri-state driver mode of operation.

24. The function block of claim 23, further comprising:
 a second configurable computation module similar to said first computation module such that four memory bits can be stored in said function block; and
 selection means for selecting one of said memory bits to drive onto said second output.

25. The function block of claim 22, wherein in a first mode of operation said first bit storage unit and said second bit storage unit are accessed serially, and wherein in said second mode of operation said first bit storage unit and said second bit storage unit are accessed independently.

26. The function block of claim 25, wherein said first logic circuit includes a plurality of multiplexers, and wherein said first bit storage unit and said second bit storage unit each include a pair of cross-coupled inverters.

27. The function block of claim 25, wherein said second logic circuit includes a tri-state buffer, a first inverter, and a second inverter, wherein said tri-state buffer has stronger drive characteristics than said first inverter and said second inverter.

28. The function block of claim 27, wherein said second logic circuit further includes a multiplexer, having an output coupled to said tri-state buffer.

29. The function block of claim 22, further comprising a combinational unit having a third plurality of inputs and an output, said combinational unit for performing combinational functions.

30. A gate array, comprising a matrix of function blocks, wherein each function block includes a configurable computation module, comprising:

a first plurality of inputs, where each input is generally for receiving a respective input signal;
a first logic circuit configurable to operate in one of first multiple modes of operation including a combinational mode of operation and a sequential mode of operation, wherein said first logic circuit is configured to operate in a combinational mode of operation by applying a first set of input signals to said first plurality of inputs and to operate in a sequential mode of operation by applying a second set of input signals to said first plurality of inputs, wherein said first logic circuit includes a first bit storage unit configurable to selectively store a first bit and a second bit storage unit configurable to selectively store a second bit, wherein in said combinational mode of operation said first bit storage unit and said second bit storage unit are configured to operate as combinational logic, and wherein in said sequential mode of operation at least one of said first bit storage unit and said second bit storage unit are configured to store a bit.

31. The gate array of claim 30, wherein said configurable computation module includes a first output for carrying a combinational output signal in said combinational mode of operation and a sequential output signal in said sequential mode of operation, and wherein a first one of said first plurality of inputs is for receiving a combinational input signal in said combinational mode of operation and a data input signal in said sequential mode of operation.

32. The gate array of claim 31, wherein said first logic circuit is configured to operate in a memory mode of operation by applying a third set of input signals to said first plurality of inputs, and wherein said first one of said first plurality of inputs is further for receiving a memory write signal in said memory mode of operation, and wherein said first output is further for carrying a read data signal in said memory mode of operation.

33. The gate array of claim 30, wherein in a first mode of operation said first bit storage unit and said second bit storage unit are accessed serially, in a second mode of operation said first bit storage unit and said second bit storage unit are accessed independently.

34. The gate array of claim 32, wherein each function block further includes a configurable communication module comprising:
 a second plurality of inputs, where each input of said second plurality of inputs is for receiving a respective input signal;
 a second logic circuit configurable to operate in one of second multiple modes of operation, wherein said second logic circuit is configured to operate in a tri-state driver mode of operation by applying a fourth set of input signals to said second plurality of inputs and to operate in a buffer mode of operation by applying a fifth set of input signals to said second plurality of inputs; and
 a second output for carrying an output signal in each of said tri-state driver and buffer modes of operation.

35. The gate array of claim 34, wherein said second logic circuit is configured to operate in a clock distribution mode of operation by applying a sixth set of input signals to said second plurality of inputs, and wherein said second output is for further carrying an output signal in said clock distribution mode of operation.

36. The gate array of claim 34, wherein each function block of said matrix further includes a plurality of computation modules and wherein said plurality of computation modules occur in a fixed ratio to said communication module.

37. The gate array of claim 36, wherein said fixed ratio is 2:1.

38. The gate array of claim 34, wherein in said memory mode of operation of said first configurable computation module in a first function block in said matrix is coupled to a first one of said second plurality of inputs in said communication module in said first function block, wherein said communication module is in said tri-state driver mode of operation.

39. The gate array of claim 35, further including:

a clock trunk, wherein said clock trunk is coupled to said communication module in each of a plurality of function blocks in said matrix, wherein said communication module in each of said plurality of function blocks is operating in said clock distribution mode of operation.

40. The gate array of claim 35, wherein:

said first logic circuit includes a plurality of multiplexers, a first pair of cross-coupled inverters, and a second pair of cross-coupled inverters; and said second logic circuit includes a tri-state buffer.

41. The gate array of claim 34, further comprising a combinational unit having a third plurality of inputs and a third output, said combinational unit for performing combinational functions.

42. The gate array of claim 34, wherein in said matrix the communication modules occur at a frequency in excess of that required for a circuit design implemented with said matrix.

* * * * *

UNITED STATES PATENT AND TRADEMARK OFFICE
CERTIFICATE OF CORRECTION

PATENT NO. : 6,014,038
DATED : January 11, 2000
INVENTOR(S) : Dana How, Adi Srinivasan, and Abbas El Gamal It is certified that error appears in the above-identified patent and that said Letters Patent is hereby corrected as shown below:

Column 17, line 50, please delete "independent" and replace it with -independently-.

Signed and Sealed this

Fifth Day of December, 2000

Attest:

Attesting Officer

Q. TODD DICKINSON

Director of Patents and Trademarks

UNITED STATES PATENT AND TRADEMARK OFFICE
CERTIFICATE OF CORRECTION

PATENT NO.   : 6,014,038
DATED        : January 11, 2000
INVENTOR(S)  : How et al.

It is certified that error appears in the above-identified patent and that said Letters Patent is hereby corrected as shown below:

Drawings,
Delete Figs 9 and 11, and replace with the attached Figs 9 and 11.

Signed and Sealed this

Twelfth Day of November, 2002

Attest:

Attesting Officer

JAMES E. ROGAN
*Director of the United States Patent and Trademark Office*